(12) United States Patent
Kim et al.

(10) Patent No.: US 11,533,814 B2
(45) Date of Patent: Dec. 20, 2022

(54) CONNECTOR AND ELECTRONIC DEVICE COMPRISING SAME

(71) Applicant: Samsung Electronics Co., Ltd., Gyeonggi-do (KR)

(72) Inventors: Kyeongho Kim, Gyeonggi-do (KR); Taeuk Kang, Gyeonggi-do (KR); Hyunsuk Choi, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 66 days.

(21) Appl. No.: 17/042,352

(22) PCT Filed: Apr. 1, 2019

(86) PCT No.: PCT/KR2019/003781
§ 371 (c)(1),
(2) Date: Sep. 28, 2020

(87) PCT Pub. No.: WO2019/194487
PCT Pub. Date: Oct. 10, 2019

(65) Prior Publication Data
US 2021/0014985 A1     Jan. 14, 2021

(30) Foreign Application Priority Data

Apr. 2, 2018 (KR) .................. 10-2018-0038278

(51) Int. Cl.
*H01R 12/50* (2011.01)
*H05K 5/00* (2006.01)
(Continued)

(52) U.S. Cl.
CPC ......... *H05K 5/0069* (2013.01); *H01R 12/526* (2013.01); *H01R 12/62* (2013.01);
(Continued)

(58) Field of Classification Search
CPC .. H05K 5/0069; H05K 5/0047; H05K 5/0017; H05K 2201/10189; H05K 1/181;
(Continued)

(56) References Cited

U.S. PATENT DOCUMENTS 5,727,971 A * 3/1998 Junkins .............. H01R 13/6593
                                                        439/607.49
6,040,624 A * 3/2000 Chambers .............. H05K 1/147
                                                        257/668
(Continued)

FOREIGN PATENT DOCUMENTS

JP          06-031168 U       4/1994
JP          06-152076 A       5/1994
(Continued)

*Primary Examiner* — Harshad C Patel
(74) *Attorney, Agent, or Firm* — Cha & Reiter, LLC

(57) ABSTRACT

According to one embodiment, an electronic device includes: a housing; a first electronic component inside the housing; a second electronic component arranged inside the housing and spaced apart from the first electronic component; a female connector electrically connected to the second electronic component, the female connector comprising multiple conductive pins; a male connector electrically connected to the first electronic component and configured to contact at least some of the multiple conductive pins of the female connector, the male connector comprising a base film, a conductive layer formed on one surface of the base film, and an adhesive layer formed on the back surface of the base film, thereby forming a lamination structure; and multiple reinforcement members provided on at least one of one surface of the base film and the back surface thereof so as to form a peripheral portion of the lamination structure.

15 Claims, 19 Drawing Sheets

(51) Int. Cl.
  *H01R 12/52* (2011.01)
  *H05K 1/18* (2006.01)
  *H05K 7/14* (2006.01)
  *H05K 1/11* (2006.01)
  *H01R 12/62* (2011.01)
  *H01R 12/77* (2011.01)

(52) U.S. Cl.
  CPC ........... *H01R 12/778* (2013.01); *H05K 1/118* (2013.01); *H05K 1/181* (2013.01); *H05K 5/0017* (2013.01); *H05K 5/0047* (2013.01); *H05K 7/1427* (2013.01); *H05K 2201/10189* (2013.01)

(58) Field of Classification Search
  CPC . H05K 1/18; H05K 1/11; H05K 1/118; H05K 7/1427; H01R 12/526; H01R 12/52; H01R 12/51; H01R 12/50; H01R 12/62; H01R 12/61; H01R 12/59; H01R 12/778; H01R 12/771; H01R 12/77–83
  See application file for complete search history.

(56) References Cited

U.S. PATENT DOCUMENTS

| | | | | |
|---|---|---|---|---|
| 6,602,092 | B2 * | 8/2003 | Soubh | H01R 12/62 439/493 |
| 6,937,462 | B2 * | 8/2005 | Kamiya | H05K 5/0069 361/752 |
| 8,797,748 | B2 * | 8/2014 | Dabov | H05K 1/147 361/748 |
| 10,209,796 | B2 * | 2/2019 | Lim | H05K 1/14 |
| 10,249,972 | B1 * | 4/2019 | Lim | H01R 12/772 |
| 10,321,587 | B2 * | 6/2019 | Lim | H01R 12/724 |
| 2006/0057887 | A1 * | 3/2006 | Lin | H01R 12/7076 439/527 |
| 2008/0064235 | A1 * | 3/2008 | Weber | H05K 1/147 439/67 |
| 2009/0027816 | A1 * | 1/2009 | Kim | H01R 13/6485 361/56 |
| 2010/0091451 | A1 * | 4/2010 | Hendren | G06F 1/1635 361/679.01 |
| 2012/0021621 | A1 * | 1/2012 | Kim | H05K 1/028 29/830 |
| 2015/0162684 | A1 * | 6/2015 | Amini | H01R 12/73 439/660 |
| 2015/0357733 | A1 * | 12/2015 | Sanford | H01R 12/62 361/749 |
| 2016/0322724 | A1 * | 11/2016 | Lee | H01R 12/771 |
| 2017/0006738 | A1 * | 1/2017 | Lee | G02F 1/13452 |
| 2017/0047791 | A1 * | 2/2017 | Jang | H02J 7/00034 |
| 2017/0271799 | A1 * | 9/2017 | Axelowitz | G06F 1/1613 |
| 2017/0290184 | A1 * | 10/2017 | Kim | H04M 1/0274 |
| 2019/0279597 | A1 * | 9/2019 | Park | G09G 3/006 |

FOREIGN PATENT DOCUMENTS

| | | |
|---|---|---|
| JP | 2006-303212 A | 11/2006 |
| JP | 2007-273655 A | 10/2007 |
| JP | 2008-300509 A | 12/2008 |
| KR | 10-0664236 B1 | 1/2007 |
| KR | 10-2011-0048082 A | 5/2011 |

* cited by examiner

CONNECTOR AND ELECTRONIC DEVICE COMPRISING SAME

CROSS-REFERENCE TO RELATED APPLICATION(S)

This application is a National Phase Entry of PCT international Application No. PCT/KR2019/003781, which was filed on Apr. 1, 2019, and claims priority to Korean Patent Application No. 10-2018-0038278 filed on Apr. 2, 2018, in the Korean Intellectual Property Office, the contents of which are incorporated herein by reference.

BACKGROUND

1. Field

Various embodiments disclosed herein relate to an electronic device and, more particularly, to an electronic device including a connector capable of electrically connecting two or more components.

2. Description of the Related Art

Typically, an electronic device means a device that performs a specific function according to a program incorporated therein, such as an electronic scheduler, a portable multimedia reproducer, a mobile communication terminal, a tablet PC, an image/sound device, a desktop/laptop PC, or a vehicular navigation system, including a home appliance. The above-mentioned electronic devices may output, for example, information stored therein as sound or an image. As the integration degree of electronic devices has increased and super-high speed and large-capacity wireless communication have become popular, various functions have recently been provided in a single mobile communication terminal. For example, various functions, such as an entertainment function (e.g., a game function), a multimedia function (e.g., a music/video reproducing function), a communication and security function for mobile banking, a schedule management function, and an e-wallet function, are integrated in a single electronic device, in addition to a communication function.

In order to integrate various functions into a single electronic device and to implement the functions, it is necessary to establish a connection between certain components in the electronic device and other components. One or more connectors may be provided in the electronic device for connection between these components. The connectors are capable of electrically connecting two or more physically separated electronic components in the electronic device.

In general, a connector may include a female connector electrically connected to one electronic component, and a male connector electrically connected to another electronic component and partially inserted into the female connector so as to enable contact connection. For example, the female connector may be electrically connected to an electronic component via a lead wire, and may have a form in which a conductive contact portion is wrapped in a plastic housing having an opening at one side thereof. The male connector may have a shape in which a conductive contact portion is exposed on a surface of a substrate (e.g., a flexible printed circuit board). In addition, one end of the male connector may be used by being inserted into an opening in the female connector.

SUMMARY

A male connector may include a plurality of conductive layers and a plurality of adhesive layers, which may form a stacked structure (hereinafter, referred to as a "stacked structure"). At this time, in the stacked structure of the male connector, the surface of a contact portion may be damaged due to damage caused by contact when the male connector is connected with a female connector or various physical impacts applied to the electronic device after the connection, and the adhesive components of the adhesive layers of the male connector may be transferred to a contact portion on the female connector, which may cause poor contact.

According to various embodiments disclosed herein, it is possible to provide a robust design structure of a male connector capable of solving the problem of the poor contact.

According to various embodiments disclosed herein, it is possible to provide a robust design structure of a female connector capable of solving the problem of the poor contact.

According to various embodiments disclosed herein, it is possible to provide an electronic device including: a housing; a first electronic component inside the housing; a printed circuit board inside the housing; a second electronic component mounted on the printed circuit board inside the housing; a female connector mounted on the printed circuit board and configured to be electrically connected to the second electronic component, the female connector including a plurality of conductive pins, which are spaced apart from each other, aligned in a first direction, and electrically connected to the second electronic component, each of the plurality of conductive pins including a U-shaped portion; and a male connector configured to be electrically connected to the first electronic component and having a stacked structure comprising a portion configured to be inserted into the U-shaped portion in a second direction substantially perpendicular to the first direction. The stacked structure may include: a first surface formed of a first material, which is an insulative material; a second surface facing away from the first surface; a plurality of first conductive lines configured to be electrically connected to the first electronic component and exposed through the first surface, each of the first conductive lines comes into electrical contact with the U-shaped portion of each of the plurality of conductive pins; and a plurality of reinforcing members arranged in at least a portion of a periphery of the stacked structure when viewed from above the first surface, the plurality of reinforcing members configured to be inserted into the U-shaped portion more deeply than the plurality of the first conductive lines, and the plurality of reinforcing members being formed of a second material having a higher rigidity than the first material.

According to various embodiments, it is possible to provide an electronic device including: a housing; a first electronic component inside the housing; a second electronic component arranged inside the housing and spaced apart from the first electronic component; a female connector electrically connected to the second electronic component, the female connector including a plurality of conductive pins; a male connector electrically connected to the first electronic component and configured to come into contact with at least some of the plurality of conductive pins of the female connector, the male connector including a base film, a conductive layer formed on one surface of the base film, and an adhesive layer disposed on the rear surface of the base film so as to form a stacked structure; and a plurality of reinforcing members provided on at least one of one surface of the base film and the rear surface thereof so as to form at least a portion of the periphery of the stacked structure.

According to various embodiments, it is possible to provide a connector including: a female connector including a plurality of conductive pins; a male connector configured to come into contact with at least some of the plurality of conductive pins of the female connector, the male connector including a base film, a conductive layer disposed on one surface of the base film, and an adhesive layer disposed on the rear surface of the base film, thereby forming a stacked structure; and a plurality of reinforcing members provided on at least one of one surface of the base film and the rear surface of the base film so as to form at least a portion of the periphery of the stacked structure.

According to various embodiments disclosed herein, it is possible to provide a connector and an electronic device, in which the adhesive components of the adhesive layer of the male connector can be prevented from being transferred to a contact portion of the female connector when the stacked structure of the male connector is damaged, for example, even if the surface of the contact portion of the male connector is damaged by contact while the male connector is being fastened with the female connector, or by various physical impacts applied to the electronic device after fastening.

That is, according to various embodiments disclosed herein, a connector and an electronic device including the same have an advantage in that it is possible to prevent various problems of poor contact occurring in the connector in advance.

DETAILED DESCRIPTION

Figure 1:
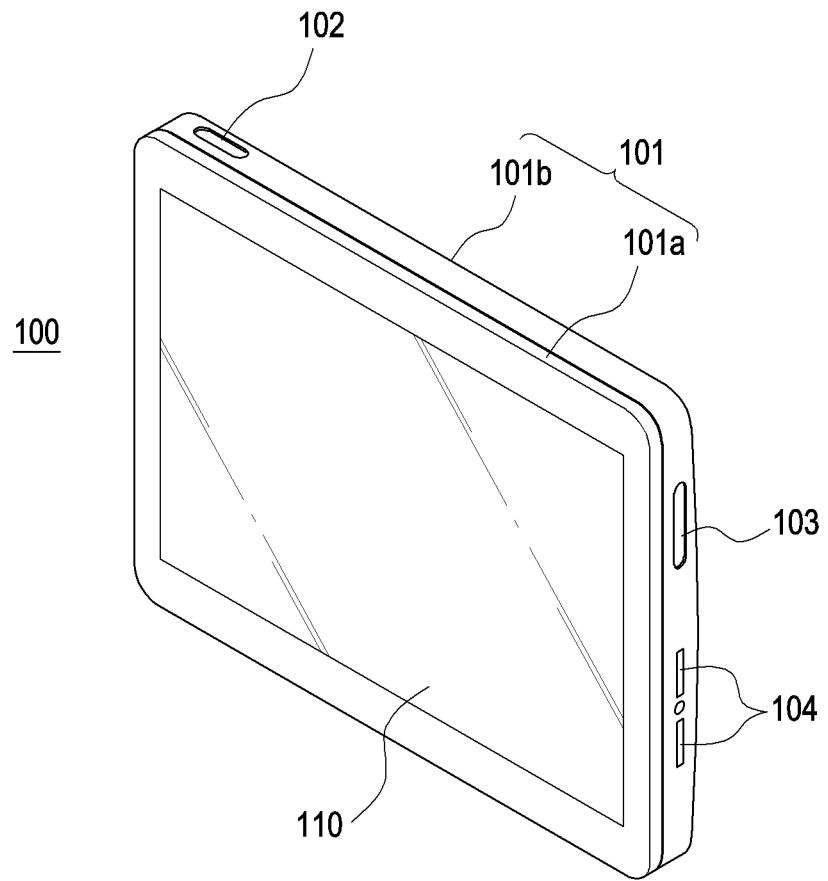
FIG. 1 is a perspective view illustrating an electronic device according to various embodiments disclosed herein.

Hereinafter, various embodiments of the disclosure will be described with reference to the accompanying drawings. It should be appreciated that the embodiments of the disclosure and the terms used therein are not intended to limit the technological features set forth herein to particular embodiments and include various changes, equivalents, or alternatives for a corresponding embodiment. With regard to the description of the drawings, similar reference numerals may be used to designate similar or relevant elements. It is to be understood that a singular form of a noun corresponding to an item may include one or more of the things, unless the relevant context clearly indicates otherwise.

As used herein, each of such phrases as "A or B" and "at least one of A or B" may include all possible combinations of the items enumerated together. The expressions "a first", "a second", "the first", "the second", and the like as used in various embodiments may modify various elements regardless of the order and/or the importance thereof. These expressions may be used only to distinguish between one element and any other element, and do not limit the corresponding elements. It should be understood that when an element (e.g., first element) is referred to as being (operatively or communicatively) "connected" or "coupled" to another element (e.g., second element), it may be directly connected or coupled directly to the other element or any other element (e.g., third element) may be interposer between them.

The expression "configured to" used in the disclosure may be interchangeably used with, for example, "suitable for", "having the capacity to", "designed to", "adapted to", "made to", or "capable of" according to the situation. The term "configured to" may not necessarily imply "specifically designed to" in hardware. Alternatively, in some situations, the expression "device configured to" may mean that the device, together with other devices or components, "is able to". For example, the phrase "processor adapted (or configured) to perform A, B, and C" may mean a dedicated processor (e.g., embedded processor) only for performing the corresponding operations or a generic-purpose processor (e.g., central processing unit (CPU) or application processor (AP)) that can perform the corresponding operations by executing one or more software programs stored in a memory device.

An electronic device according to various embodiments of the disclosure may include at least one of, for example, a smartphone, a tablet personal computer (PC), a mobile phone, a video phone, an electronic book reader (e-book reader), a desktop PC, a laptop PC, a netbook computer, a workstation, a server, a personal digital assistant (PDA), a portable multimedia player (PMP), a MPEG-1 audio layer-3 (MP3) player, a mobile medical device, a camera, and a wearable device. The wearable device may include at least one of an accessory type (e.g., watch, ring, bracelet, anklet, necklace, glasses, contact lens, or head-mounted device (HMD)), a fabric or clothing-integrated type (e.g., electronic clothing), a body-mounted type (e.g., skin pad, or tattoo), and a bio-implantable type (e.g., implantable circuit). According to some embodiments, the electronic device may include at least one of, for example, a television, a digital video disk (DVD) player, an audio, a refrigerator, an air conditioner, a vacuum cleaner, an oven, a microwave oven, a washing machine, an air purifier, a set-top box, a home automation control panel, a security control panel, a TV box (e.g., Samsung HomeSync™, Apple TV™, or Google Tv™, a game console (e.g., Xbox™ and PlayStation™), an electronic dictionary, an electronic key, a camcorder, and an electronic photo frame.

According to other embodiments, the electronic device may include at least one of various medical devices (e.g., various portable medical measuring devices (blood glucose monitoring device, heart rate monitoring device, blood pressure measuring device, body temperature measuring device, etc.), magnetic resonance angiography (MRA), magnetic resonance imaging (MRI), computed tomography (CT) machine, ultrasonic machine, etc.), a navigation device, a global positioning system (GPS) receiver, an event data recorder (EDR), a flight data recorder (FDR), a vehicle infotainment device, electronic equipment for a ship (e.g., ship navigation device, gyro-compass, etc.), avionics, a security device, an automobile head unit, a home or industrial robot, an Automatic Teller's Machine (ATM) in banks, Point Of Sales (POS) in a shop, or Internet of things devices (e.g., light bulb, various sensors, electric or gas meter, sprinkler device, fire alarm, thermostat, streetlamp, toaster, sporting goods, hot water tank, heater, boiler, etc.). According to some embodiments, the electronic device may include at least one of a part of furniture or a building/structure, an electronic board, an electronic signature receiving device, a projector, and various kinds of measuring instruments (e.g., water meter, electric meter, gas meter, radio wave meter, etc.). In various embodiments, the electronic device may be flexible, or may be a combination of one or more of the aforementioned various devices. The electronic device according to various embodiments of the disclosure is not limited to the aforementioned devices. In various embodiments of the disclosure, the term "user" may refer to a person using an electronic device or a device (e.g., artificial intelligence electronic device) using an electronic device.

Figure 2:
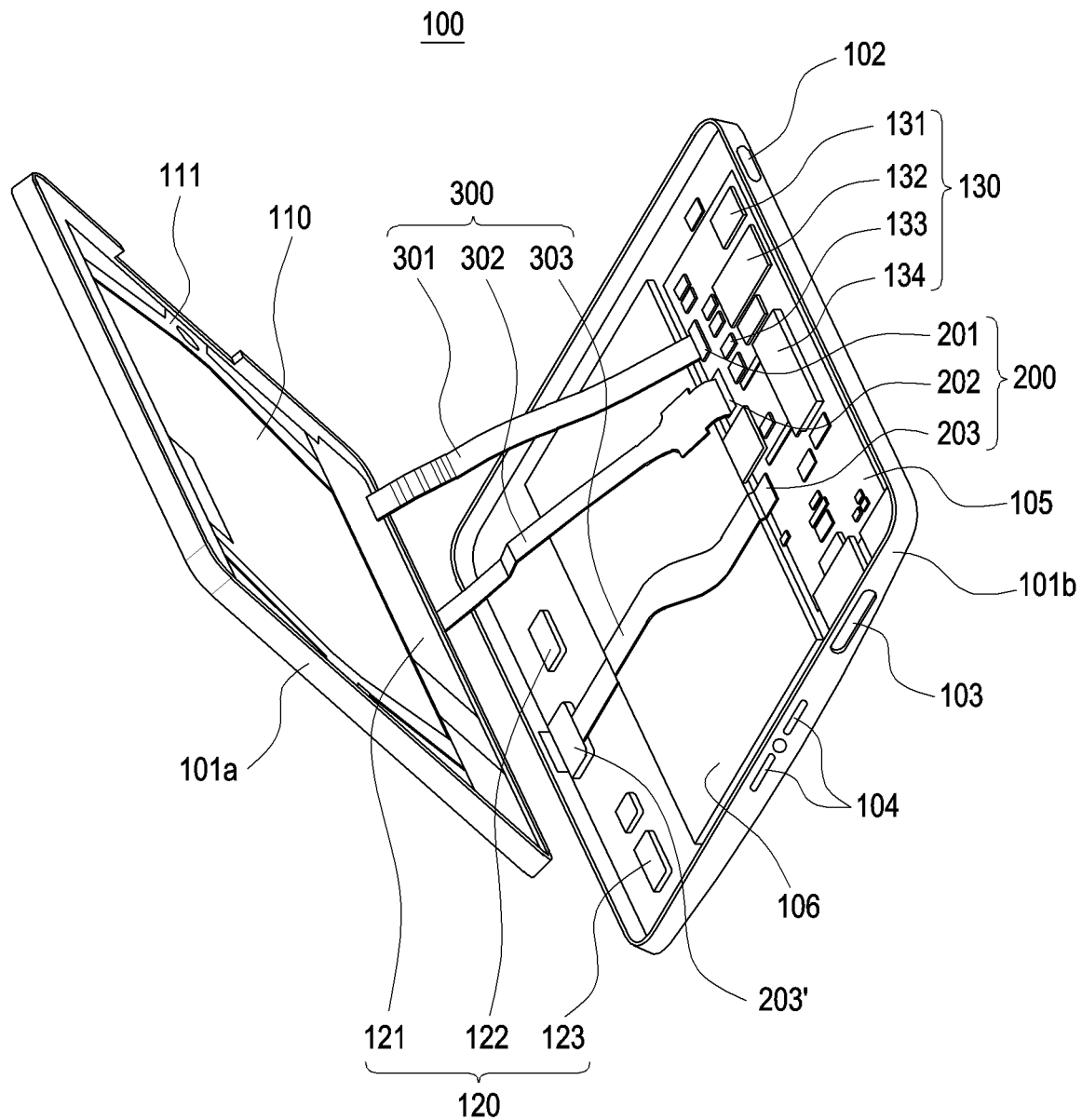
FIG. 2 is a perspective view illustrating the inner features of the electronic device according to various embodiments disclosed herein.

FIG. 1 is a perspective illustrating an electronic device 100 according to various embodiments disclosed herein. FIG. 2 is a perspective view illustrating the inner features of the electronic device 100 according to various embodiments disclosed herein.

As illustrated in FIGS. 1 and 2, the electronic device 100 according to various embodiments of the disclosure may include a housing 101. According to an embodiment, the housing 101 may be divided into a front housing 101a and a rear housing 101b. The housing 101 may be manufactured in a form in which one surface (e.g., the front housing 101a) is open, and a display device or a touch screen panel 110 may be provided on the open surface. The display device or the touch screen panel 110 may form the exterior of the electronic device 100 together with the housing 101.

According to various embodiments, the housing 101 may include, for example, a switch hole 102 for installing a power switch or a direction key used for volume control, menu movement, or the like, a slot 103 for inserting a storage medium such as a memory card, a jack hole (not illustrated) for connecting an ear phone, and a speaker hole 104 for outputting sound from a speaker device. These holes are generally located in the side surface of the housing 101 to penetrate the housing 101 so as to connect the inside and the outside of the housing 101.

According to various embodiments, the housing 101 may form a space for accommodating various electronic components therein. Inside the housing 101, structures (e.g., a bracket) for fixing and supporting a printed circuit board 105 to be described below or modules for implementing various functions (e.g., a camera module and a speaker module) or the like may be disposed. In addition, a wiring groove for wiring of a flexible printed circuit board (FPCB) may be formed in the inner surface of the housing 101.

According to various embodiments, the front housing 101a may include a display device or a touch screen panel 110 and a chassis 111 coupled to surround the display device or touch screen panel 110. Various electronic components may be coupled to one surface of the chassis 111. For example, electronic components for driving the display device or the touch screen panel 110 (e.g., a driving IC of the display device or the touch screen panel) may be coupled to one surface of the chassis 111, or a flexible printed circuit board (FPCB) or the like for connecting the display device or the touch screen panel 10 another circuit device may be coupled to the one surface of the chassis 111.

According to various embodiments, electronic components, such as an antenna module that enables wireless communication of the electronic device 100, a processor, and a battery pack 106, may be provided in the rear housing 101b. Electronic components such as the antenna module, the processor, and the battery pack 106 may be interposed between the inner surfaces of the rear housing 101b, and a groove may be formed in the rear housing 101b so as to at least partially accommodate the electronic components.

The flexible printed circuit board (FPCB) may extend to the rear surface of the display device or the touch screen panel 110, and may be wired between the display device or the touch screen panel 110 and the battery pack 106. In addition, a plurality of flexible printed circuit boards (FPCBs) may be provided in the electronic device 100. One end of a flexible printed circuit board (FPCB) may be connected to a display element and the other end may be connected to a processor so as to transmit an image signal from the processor to the display device. One end of a flexible printed circuit board (FPCB) may be connected to a display element and the other end may be connected to a battery pack 106 so as to supply power from the battery pack 106 to the display element.

According to various embodiments disclosed herein, a first electronic component 120 and a second electronic component 130 may be included in the housing 101. A plurality of first electronic components 121, 122, and 123 and a plurality of second electronic components 131, 132, 133 and 134 may be included in the housing 101.

According to various embodiments, the first electronic component 120 may correspond to the display device or the touch screen panel 110, or may correspond to an electronic component for driving the display device or the touch screen panel 110 (e.g., a drive IC of the display device or the touch screen panel). The second electronic component 130 may correspond to electronic components such as an antenna module, a processor, and a battery pack 106. However, the first electronic component 120 and the second electronic component 130 according to various embodiments disclosed herein are not limited to the embodiments of the drawings. The positions at which the first electronic component 120 and the second electronic component 130 are disposed or the component-specific functions thereof are not limited to any specific embodiments. For example, it should be noted that, although FIG. 2 illustrates that the first electronic component 120 is disposed on the inner surface of the front housing 101a and the second electronic component 130 is disposed on the inner surface of the rear housing 101b for convenience of description, the disclosure is not necessarily limited thereto.

According to various embodiments, one or more printed circuit boards 105 may be accommodated in the housing 101. In the embodiment illustrated in FIG. 2, it is illustrated that a printed circuit board 105 is disposed on the inner surface of the rear housing 101b. However, according to another embodiment, the printed circuit board 105 may be disposed in the front housing 101a. Alternatively, the printed circuit board 105 may be disposed both of the front housing 101a and the rear housing 101b. That is, it should be noted that the printed circuit board 105 is not limited to any specific embodiment.

According to various embodiments, the second electronic component 130 may be an electronic component mounted on the printed circuit board 105. According to an embodiment, the electrical connection between the first electronic component 120 and the second electronic component 130 may be implemented using a flexible printed circuit board (FPCB) extending from the first electronic component 120 to the second electronic component 130 mounted on the printed circuit board 105 and fixed in position.

The electronic device 100 according to various embodiments disclosed herein may include a female connector 200 electrically connected to the second electronic component 130. According to an embodiment, the female connector 200 may be mounted on the printed circuit board 105 and used like the second electronic component 130.

The electronic device 100 according to various embodiments disclosed herein may further include a male connector 300 electrically connected to the first electronic component 120. According to an embodiment, the male connector 300 may be formed in the form of a flexible printed circuit board (FPCB), thereby implementing an electrical connection between electronic components arranged to be spaced apart from each other inside the housing 101 by a considerable distance.

According to various embodiments, a plurality of female connectors 200 and a plurality of male connectors 300 may be provided. As in the embodiment illustrated in FIG. 2, a plurality of male connectors 301, 302, and 303 may be provided to correspond to a plurality of female connectors 201, 202, and 203.

According to various embodiments, one male connector 301 or 302 may be connected to one female connector 201 or 202, but according to another embodiment, two different female connectors 203 and 203' may be connected using a single male connector 303. According to an embodiment, in the case of connecting different female connectors 203 and 203' using one male connector 303, one 203' of the two female connectors may correspond to an interface connector connected to an external input device (or an external storage device).

Figure 3A:
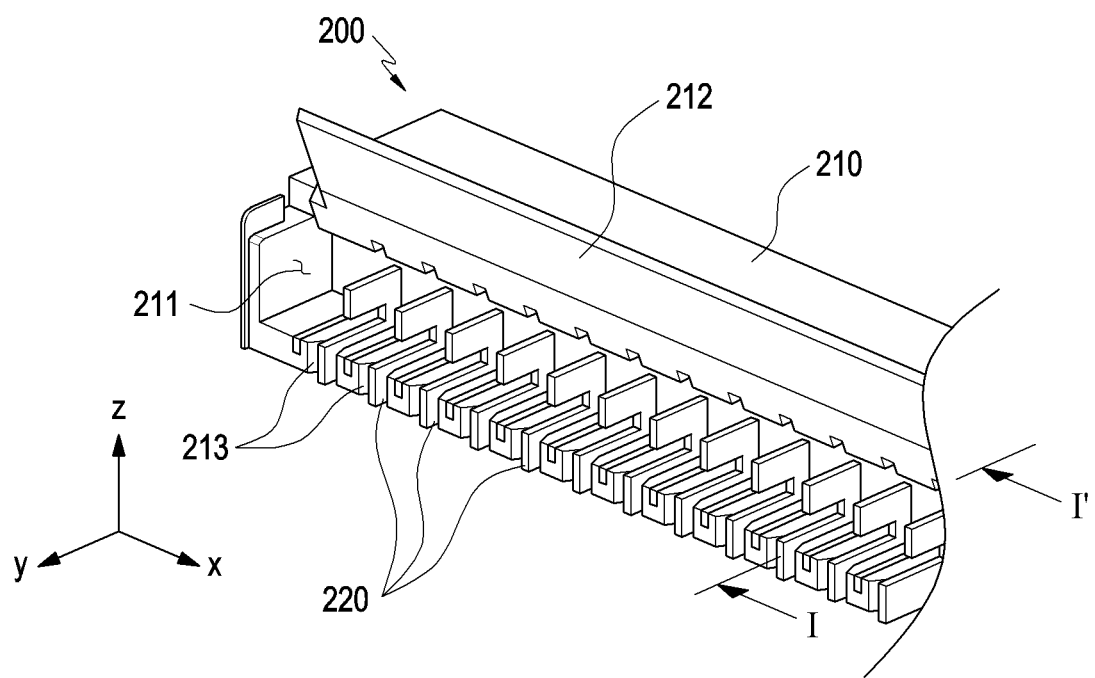
FIG. 3A is a perspective view illustrating a female connector according to various embodiments disclosed herein.
Figure 3B:
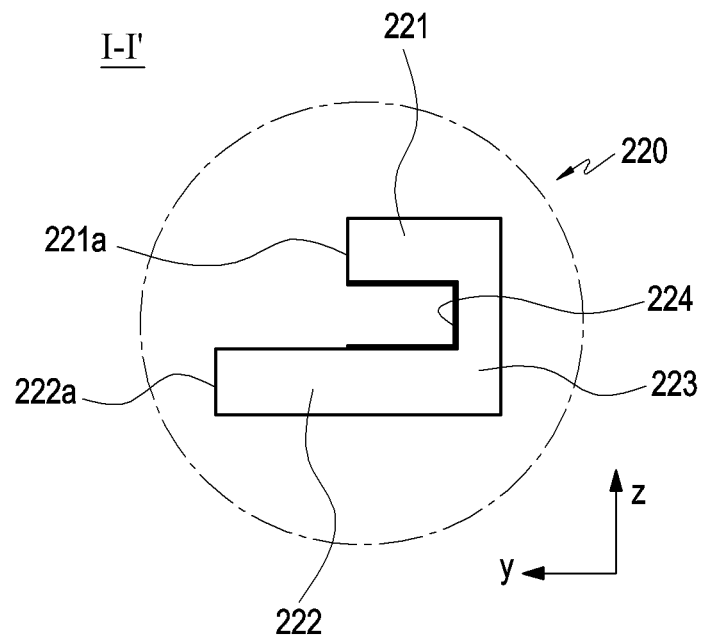
FIG. 3B is a side view illustrating a conductive pin according to various embodiments disclosed herein.
Figure 4:
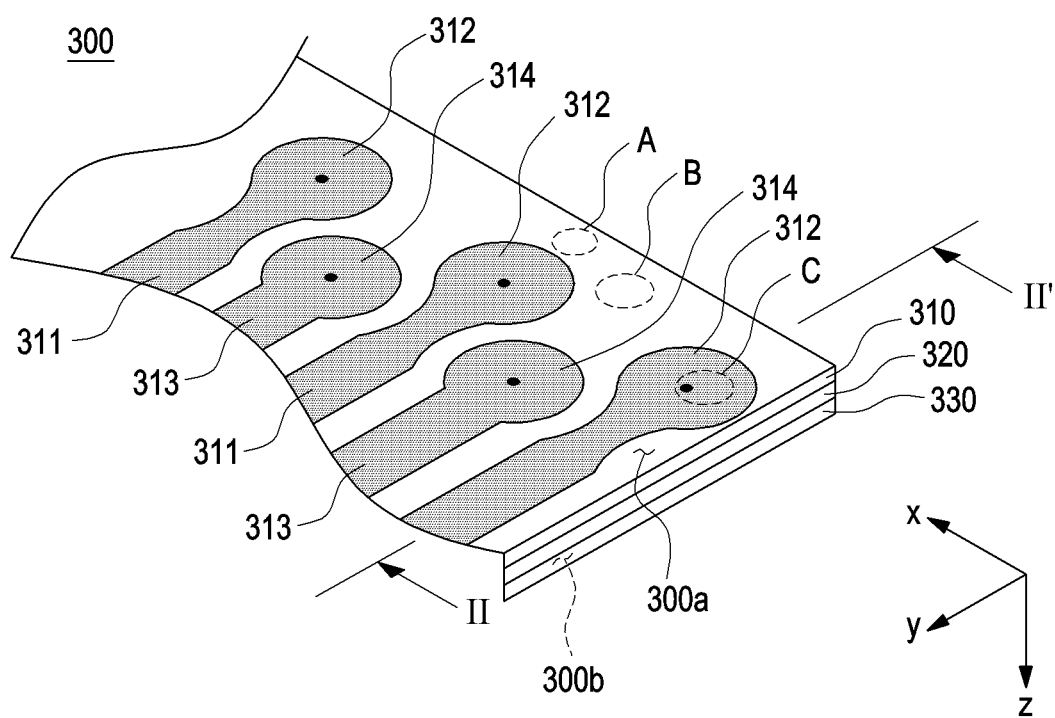
FIG. 4 is a perspective view schematically illustrating a mail connector according to various embodiments disclosed herein.

FIG. 3A is a perspective view illustrating a female connector 200 (e.g., 200 in FIG. 2) according to various embodiments disclosed herein. FIG. 3B is a side view illustrating a plurality of conductive pins 220 according to various embodiments disclosed herein. FIG. 4 is a perspective view schematically illustrating a male connector 300 (e.g., 300 in FIG. 2) according to various embodiments disclosed herein.

Regarding the direction components illustrated in FIGS. 3A to 4, in the drawings according to various embodiments of the disclosure, the direction components x, y, and z may mean reference directions corresponding to a rectangular coordinate system in a space. According to various embodiments disclosed herein, a first direction may be a direction parallel to a direction in which the direction component x is oriented, and a second direction may be a direction parallel to a direction opposite to the direction in which the direction component y is oriented. The direction components illustrated in FIGS. 3A to 4 may be referred to in FIGS. 5B to 15 to be described later.

According to various embodiments, the female connector 200 may include a female housing 210, and an opening 211 may be formed at one side of the female housing 210. Here, the opening 211 is formed to extend along the width direction of the female housing 210 (e.g., a direction parallel to the x axis in FIG. 3A), and may form a space for accommodating the male connector 300. According to an embodiment, a cover 212 may be disposed on one surface of the female housing 210 to be rotatable about a direction parallel to the width direction of the female housing 210 as an axis. The degree of exposure of the opening 211 to the outside of the female housing 210 may be adjusted using the cover 212. For example, when the male connector 300 is fastened to the female connector 200, the cover 212 is opened, and after the male connector 300 is fastened to the female connector 200, the cover 212 may cover one side of the male connector 300.

According to various embodiments, a plurality of grooves 213 may be formed in one surface of the female housing 210. According to an embodiment, the plurality of grooves 213 are formed adjacent to the opening 211, and may be arranged in parallel at a predetermined pitch along the width direction of the female housing 210.

Referring to FIG. 3A, the female connector 200 may include a plurality of conductive pins 220, which are spaced apart from each other, aligned in one direction, and electrically connected to the second electronic component (e.g., 130 in FIG. 2). Here, the direction in which the plurality of conductive pins 220 are aligned may be a direction parallel to the x axis, and may be inserted into the plurality of grooves 213 and arranged in parallel at a predetermined pitch. According to an embodiment, in the case where each of the plurality of conductive pins 220 is accommodated in corresponding one of the plurality of grooves 213, at least a portion of each conductive pin may be designed to be exposed to the outside through the opening 211.

Referring to FIG. 3B, a conceptual view of one of the plurality of conductive pins 220 is illustrated. As in the embodiment illustrated in FIG. 3B, according to various embodiments, each of the plurality of conductive pins 220 may include a support portion 221 positioned thereabove when viewed from a side so as to support a second surface (e.g., 300b in FIG. 4) of the male connector 300 (e.g., 300 in FIG. 2). Each of the plurality of conductive pins 220 may include a contact portion 222 positioned therebelow when viewed from a side so as to come into electrical contact with a first surface (e.g., 300a in FIG. 4) of the male connector 300 (e.g., 300 in FIG. 2). Each conductive pin may include a connection portion 223 integrally connecting the support portion 221 and the contact portion 222 to each other.

According to various embodiments, as in the embodiment illustrated in FIG. 3B, each of the plurality of conductive pins 220 may include a U-shaped portion 224 (or a ⊏-shaped portion). For example, as in the embodiment illustrated in FIG. 3B (indicated by the thick solid line), the U-shaped portion may be a portion of a region including a boundary at which the support portion 221 and the connection portion 223 are connected to each other and a boundary at which the contact portion 222 and the connection portion 223 are connected to each other. The U-shaped portion 224 schematically illustrated in the drawing corresponds to the entire shape of one of the plurality of conductive pins 220, but is not limited thereto. According to an embodiment, only a portion of the entire shape of the conductive pin may have the U-shaped portion 224.

According to the embodiment illustrated in FIG. 3B, a support end portion 221a of the support portion 221 is illustrated to be flat, but is not necessarily limited thereto. The support end portion may have a tip formed in a curved shape (e.g., a hook). According to the embodiment illustrated in FIG. 3B, a contact end portion 222a of the contact portion 222 is illustrated to be flat, but is not necessarily limited thereto. The support portion 221 and the contact portion 222 may extend parallel to each other from the connection portion 223, but may extend not parallel to each other. Hereinafter, it will be described later with reference to FIG. 5B.

According to various embodiments, as in the embodiment illustrated in FIG. 4, the male connector 300 may be formed in a stacked structure. The stacked structure may include a portion inserted into the U-shaped portion 224 in the second direction substantially perpendicular to the first direction, which is a direction in which the plurality of conductive pins 220 are aligned. For example, if the first direction is a direction parallel to the x axis, the stacked structure is capable of moving back and forth in a direction parallel to the y axis, and is in close contact with the U-shaped portion 224 so as to be mounted in the female connector 200.

According to various embodiments, the stacked structure of the male connector 300 may include a base film 320. In addition, the stacked structure may include a first layer 310 disposed on one surface of the base film 320 and including first conductive lines 311 and 313, and may further include a second layer 330 disposed on the rear surface of the base film 320 to form a second surface 300b and including second conductive lines.

According to various embodiments, the first surface 300a may be a surface formed on the first layer 310 or the base film 320. For example, the first surface 300a may correspond to one surface formed by the first layer 310. However, when the remaining portion of the first layer 310, except for the first conductive lines 311 and 313, is etched or at least a portion of an end portion of the first layer 310 illustrated in FIG. 4 is formed to have a hollow shape from the beginning, the first surface 300a may correspond to a portion of the surface on which the base film 320 is formed.

According to various embodiments, the second surface 300b may be a surface formed on a side opposite to the first surface 300a, wherein the second surface 300b may be a surface formed on the second layer 330.

Referring to the embodiments of FIGS. 3A and 4 with reference to the direction components illustrated in the drawings, the male connector 300 illustrated in FIG. 4 may be inserted into the female connector 200 illustrated in FIG. 3A in the state in which the first surface 300a faces downward unlike the orientation in FIG. 4 and the second surface 300b faces upwards unlike the orientation in FIG. 4. Accordingly, the plurality of first conductive lines 311 and 313 exposed through the first surface 300a may come into electrical contact with the plurality of conductive pins 220 at positions corresponding thereto, respectively. According to an embodiment, when the end of the male connector 300 is inserted into the U-shaped portion 224, the first surface 300a of the male connector 300 comes into contact with the contact portions 222 of the female connector 200, and the second surface 300b of the male connector 300 may be fastened in a form capable of being supported by the support portions 221 of the female connector 200.

Figure 5A:
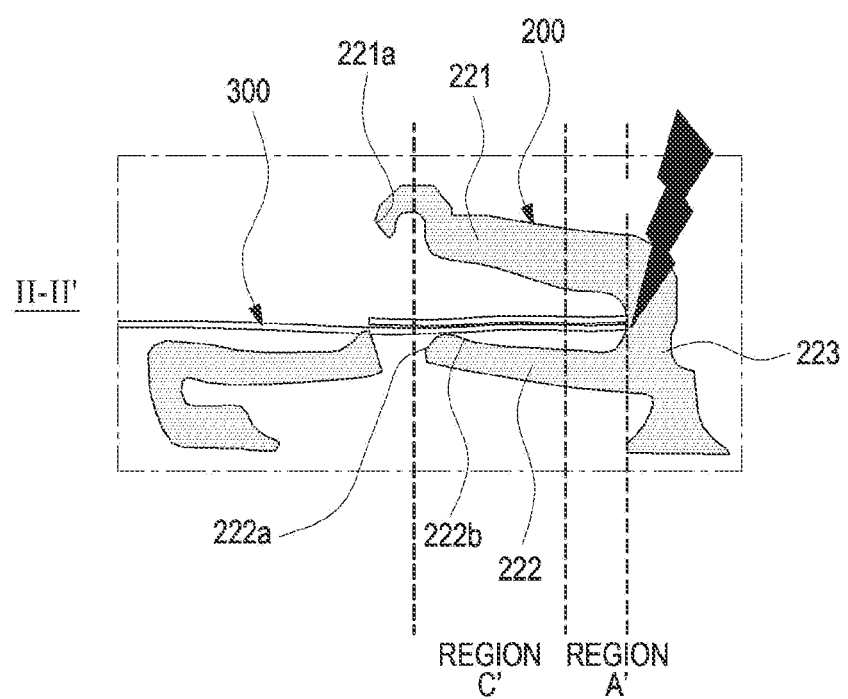
FIG. 5A is a view illustrating a photograph of a cross section taken along line II-II' of FIG. 4 when the male connector is inserted into the female connector according to various embodiments disclosed herein.
Figure 5B:
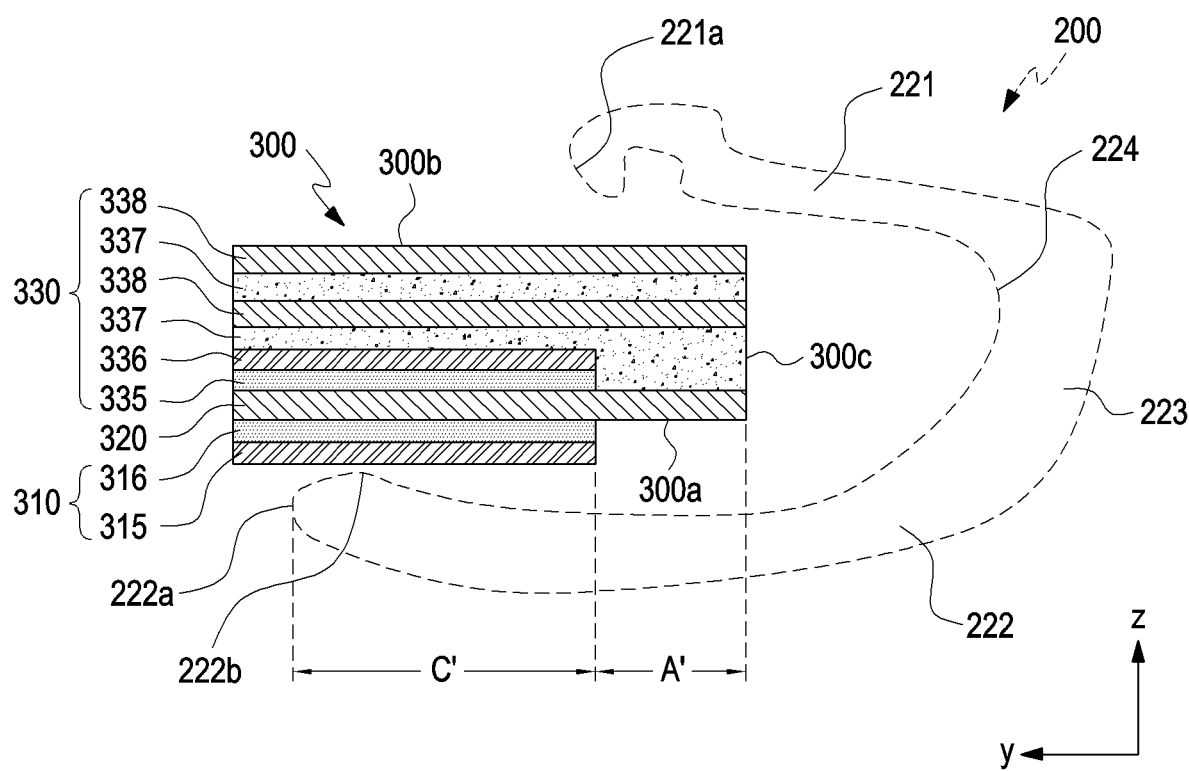
FIG. 5B is a conceptual view illustrating a cross section taken along line II-II' of FIG. 4 according to various embodiments disclosed herein.

FIG. 5A is a view illustrating a photograph of a cross section taken along line II-II' of FIG. 4 when the male connector 300 is inserted into the female connector 200 according to various embodiments disclosed herein. FIG. 5B is a conceptual view illustrating a cross section taken along line II-II' of FIG. 4 according to various embodiments disclosed herein.

According to various embodiments, the male connector 300 may be formed in a stacked structure including a base film 320, a plurality of conductive layers, a plurality of insulating resin layers, and a plurality of adhesive layers.

According to various embodiments, the plurality of conductive layers may be formed of a conductive film (e.g., copper or a copper alloy) and a plating layer (e.g., a combination of one or more of an Au plate, a Cu plate, a carbon plate, and a solder plate), and the plating layer may be formed on the uppermost surface of the plurality of conductive layers. According to various embodiments, as the plating layer, a plating layer having good corrosion resistance or abrasion resistance may be selected.

According to various embodiments, the plurality of insulating resin layers may include polyimide, polyester, and polyethylene naphthalate (PEN). According to an embodiment, the base film 320 may also be formed of an insulating resin. The insulating resin layers may include polyimide, polyester, and polyethylene naphthalate (PEN) in the form of films. According to various embodiments, thermal curing, ultraviolet curing, photosensitive ink, or the like may be additionally applied to the insulating resin layers.

Referring to FIG. 5B, as illustrated in the drawing, an example of the male connector 300 includes a base film 320, a first layer 310 disposed on one surface of the base film 320, and a second layer 310 disposed on the rear surface of the base film 320. Here, as illustrated in the drawing, the first layer 310 includes a first plating layer 315 and a first conductive film 316, and the second layer 330 includes a second plating layer 336, a second conductive film 335, two adhesive layers 337, and two insulating resin layers 338, wherein the two adhesive layers 337 and two insulating resin layers 338 are alternately stacked.

According to various embodiments, the insulating resin layers 338 are provided separately from the base film 320, and the adhesive layers 337 may be disposed to connect the insulating resin layers 338 and the base film 320 to each other. According to an embodiment, the adhesive layers 337 may be disposed on the rear surface of the base film 320 and may be formed to surround the second plating layer 336 and the second conductive film 335. For reference, it should be noted that the stacked structure of the male connector 300 may be changed depending on the stacked shape of each of the first and second layers 310 and 330. According to an embodiment, the size and number of the adhesive layers 337 and the insulating resin layers 338 may be changed depending on the height of the U-shaped portion 224 of the female connector 200.

According to the embodiment illustrated in FIG. 5B, the first surface 300a may be formed by the base film 320, and the second surface 300b may be formed by the second layer 330. According to an embodiment, a third surface 300c constituting at least a portion of a periphery of the stacked structure (or an end portion of the stacked structure) may be formed in the stacked structure of the male connector 300. According to an embodiment, the third surface 300c may be perpendicular to the first surface 300a and perpendicular to the second surface 300b. According to another embodiment, the third surface 300c is not necessarily perpendicular to the first surface 300a and the second surface 300b, but may be formed at least partially in an inclined shape or at least partially in a curved shape.

In the plurality of conductive pins 220 of the female connector 200 according to various embodiments disclosed herein, as illustrated in FIG. 5B, the support end portion 221a of the support portion 221 may be formed in a hook shape. According to various embodiments, some (e.g., 222b) of the contact end portions 222a and 222b of the contact portions 222 may be formed to protrude toward a space formed by the U-shaped portion 224. According to an embodiment, the plurality of conductive pins 220 may be formed of an elastically deformable material. Through this, when the female connector 200 and the male connector 300 are fastened to each other, the fastening force may be improved using the structural elasticity of the conductive pins 220.

Referring to FIGS. 5A and 5B together, in the process of fastening the male connector 300 to the female connector 200, the periphery of the male connector 300, that is, the third surface 300c, may be inserted into the space formed by the U-shaped potions 224. According to an embodiment, the vicinity of an edge that forms a boundary between the first surface 300a and the third surface 300c may come into contact with the U-shaped portion 224. In the embodiments described above, damage may occur to the stacked structure of the male connector 300 due to contact during in the process of fastening the male connector 300 with the female connector 200. On the other hand, the surfaces of the contact portions may be damaged due to various physical impacts applied to the electronic device (e.g., 100 in FIG. 2) after fastening, and the adhesive components of the adhesive layers 337 of the male connector 300 may be transferred to the contact portions of the female connector 200, causing poor contact. According to an embodiment, a situation, in which the protruding contact end portions 222b of the plurality of conductive pins 220, which come into contact with the first plating layer 315, presses the base film 320, may occur. In that case, damage may occur to the base film 320, the hardness of which is not high, and thus the adhesive components of the adhesive layers 337 may be transferred to the contact portions 222 of the female connector 200.

Figure 6:
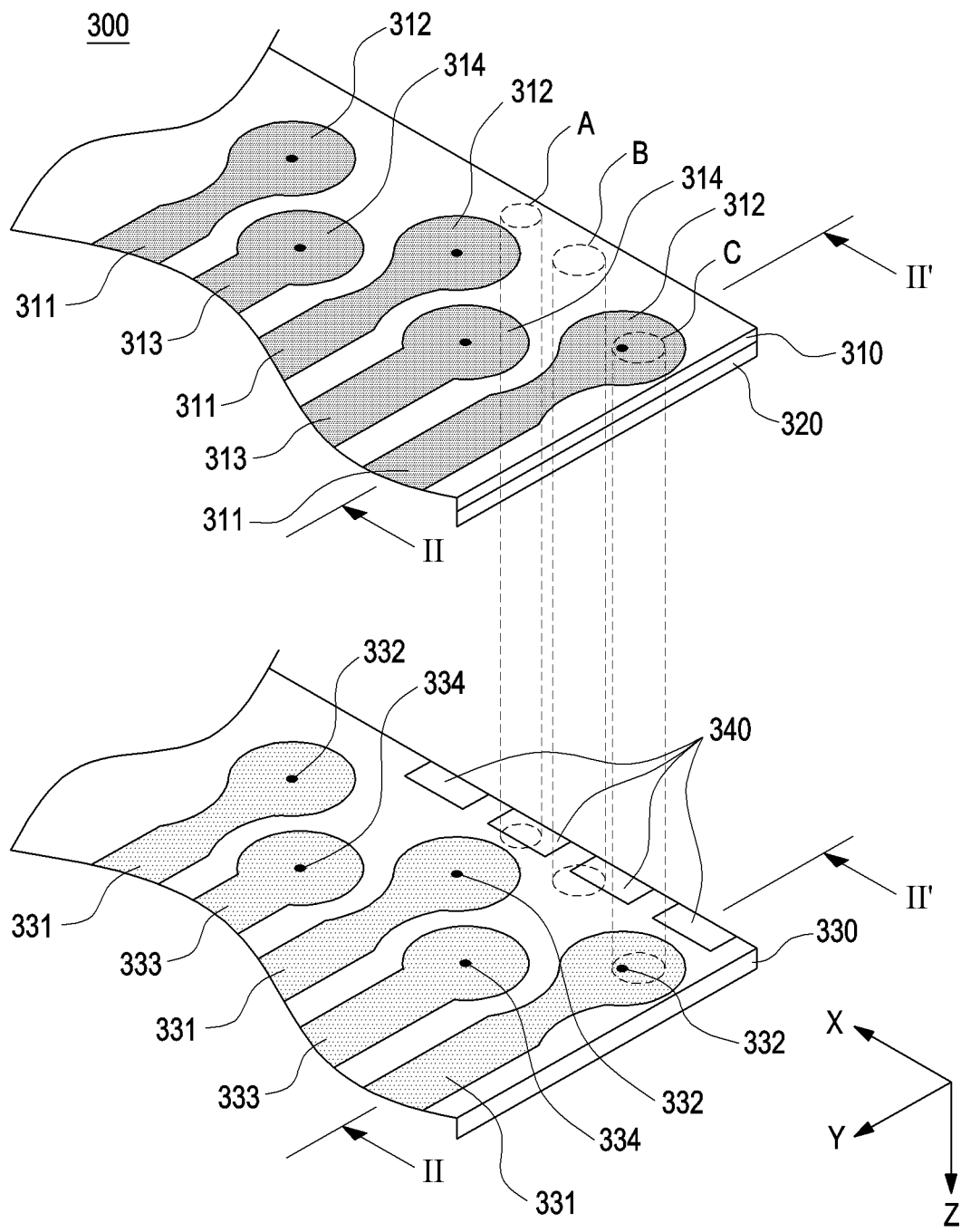
FIG. 6 is an exploded perspective view schematically illustrating a mail connector in which a plurality of reinforcing members are arranged on a second layer according to various embodiments disclosed herein.
Figure 7A:
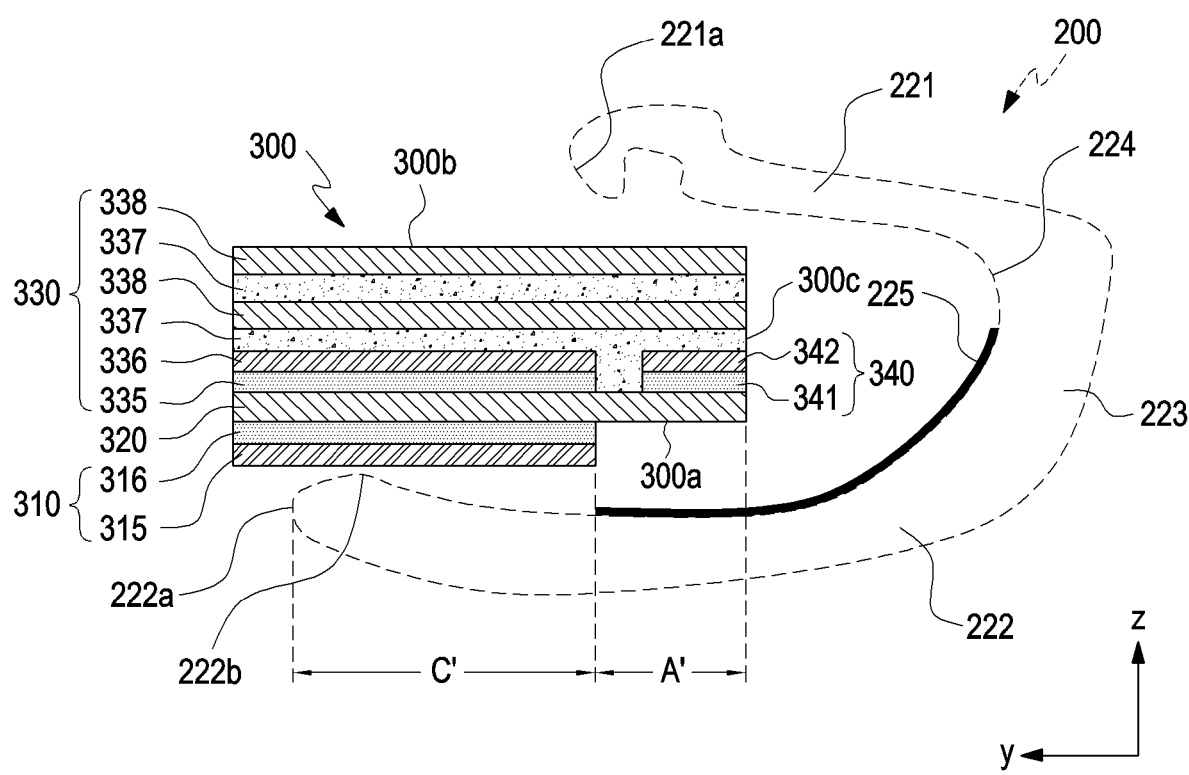
FIG. 7A is a conceptual view illustrating a cross section taken along line II-II' in FIG. 6, according to an embodiment.
Figure 7B:
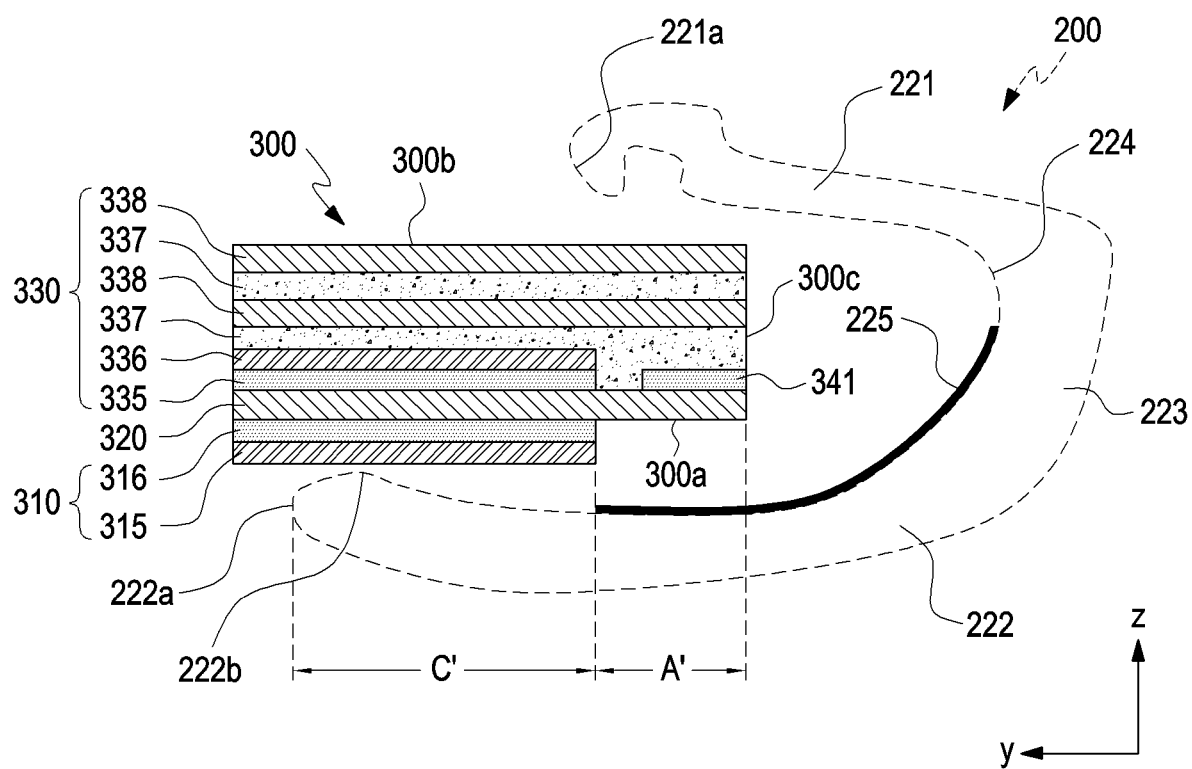
FIG. 7B is a conceptual view illustrating a cross section taken along line II-II' in FIG. 6, according to an embodiment different from that of FIG. 7A.

FIG. 6 is an exploded perspective view schematically illustrating the male connector 300 in which a plurality of reinforcing members 340 are arranged on the second layer 330 (e.g., 330 in FIG. 4) according to various embodiments disclosed herein. FIG. 7A is a conceptual view illustrating a cross section taken along line II-II' in FIG. 6 (e.g., II-II' in FIG. 4), according to an embodiment. FIG. 7B is a conceptual view illustrating a cross section taken along line II-II' in FIG. 6 (e.g., II-II' of FIG. 4), according to another embodiment.

According to various embodiments, in the stacked structure of the male connector 300, a plurality of second conductive lines 331 and 333 may be formed on the second layer 330. According to an embodiment, the plurality of second conductive lines 331 and 333 may be disposed to overlap the plurality of first conductive lines 311 and 313 when viewed from above the first surface 300a in a projection manner.

According to various embodiments disclosed herein, as in the embodiment illustrated in FIG. 6, the male connector 300 may include a plurality of reinforcing members 340 disposed in at least a portion of the periphery of the stacked structure when viewed from above the first surface 300a (when the male connector 300 is viewed in a direction parallel to the z direction). In various embodiments disclosed herein, the reinforcing members 340 are dummy portions that are not related to the electrical connection of the connector. The reinforcing members 340 may be located above the adhesive layers 337 so as to protect the adhesives layer 337 from an external impact.

According to an embodiment, when the stacked structure is viewed from above the first surface 300a in a projection manner, the plurality of reinforcing members 340 may be disposed between the second conductive lines 331 and 333 and a third surface (e.g., 300c in FIG. 7A). In addition, according to an embodiment, the plurality of reinforcing members 340 may be arranged on a straight line in the width direction of the male connector 300 (e.g., the x direction in FIG. 4).

Referring to FIGS. 6 to 7B together with FIG. 4, at least a portion of the top surface of the male connector 300 may be arbitrarily divided to set regions (regions A, B, and C). Through this, the regions in which the plurality of reinforcing members 340 are disposed may be set. Here, the arbitrarily divided regions (the regions A, B, and C) may be virtual regions provided for convenience of description of the disclosure. For example, the region A may correspond to a region between a contact 312 at the end of each of the first conductive lines 311 and the third surface (e.g., 300c in FIG. 7A). The region B may correspond to a region between a contact 314 at the end of each of the first conductive lines 313 and the third surface (e.g., 300c in FIG. 7A). The region C may correspond to a region located within a contact 312 at the end of each of the first conductive line 311. In addition, as in the embodiment illustrated in FIGS. 7A and 7B, at least a portion of the cross section of the male connector 300 may be arbitrarily divided to set regions (regions A' and C'). According to an embodiment, the region A' may correspond to the region A, and the region C' may correspond to the region C. Through this, the cross section of the male connector 300 may be divided into, for example, the region A' in which the plurality of reinforcing members 340 are disposed and the region C' in which the plurality of reinforcing members 340 are not disposed.

As described above, a plating layer having relatively higher corrosion resistance and abrasion resistance than the adhesive layers may be disposed on the uppermost portion of the contact 312 of each of the first conductive line 311, corresponding to the region C. Therefore, even if the contacts 312 corresponding to the regions C come into contact with the contact end portions 222b of the contact portions 222 of the female connector 200, the adhesive components may be less likely to be transferred to the contact portions 222. On the contrary, the first layer 310 or the base film 320 corresponding to the regions A and B has relatively low corrosion resistance and abrasion resistance compared to the first conductive lines 311. Thus, when the first layer 310 or the base film 320 comes into contact with the contact portions of the female connector 200, the adhesive components may be highly likely to be transferred to the contact portions 222. Accordingly, according to various embodiments disclosed herein, by providing the reinforcing members 340 in the regions A and B, it is possible to prevent poor contact of the connector in advance.

Referring to FIGS. 7A and 7B together, in the electronic device 100 according to various embodiments, the reinforcing members 340 may be formed of a conductive film or a combination of a conductive film and a plating layer. These reinforcing members 340 are disposed in at least a portion of the periphery of the stacked structure, and thus may be exposed to the outside through the third surface 300c. At this time, even if the end side of the male connector 300 (e.g., the base film 320) is in strong contact with the contact end portions 222b of the contact portions 222, the adhesive layers 337 are protected by the reinforcing members 340, and thus the adhesive components can be prevented from being transferred.

According to various embodiments disclosed herein, an insulating material 225 covering at least a portion of the U-shaped portion 224 may be included. The insulating material 225 may be interposed between the reinforcing members 340 and the U-shaped potion 224. As a result, when the male connector 300 is inserted deeply into the space formed by the U-shaped potion 224, it is possible to insulate portions that are in contact between the reinforcing members 340 and the U-shaped portion 224. According to an embodiment, even if the reinforcing members 340 formed of a metallic material are provided to ensure the rigidity of the stacked structure, it is possible to prevent a short of an electrical signal by providing the insulating material 225.

According to various embodiments disclosed herein, the reinforcing members 340 may be arranged in various shapes (widths and lengths) and numbers on the male connector 300. According to various embodiments, the male connector 300 may further include reinforcing members 350 disposed on the first layer 310 in addition to the reinforcing members 340 disposed on the second layer 330.

Figure 8:
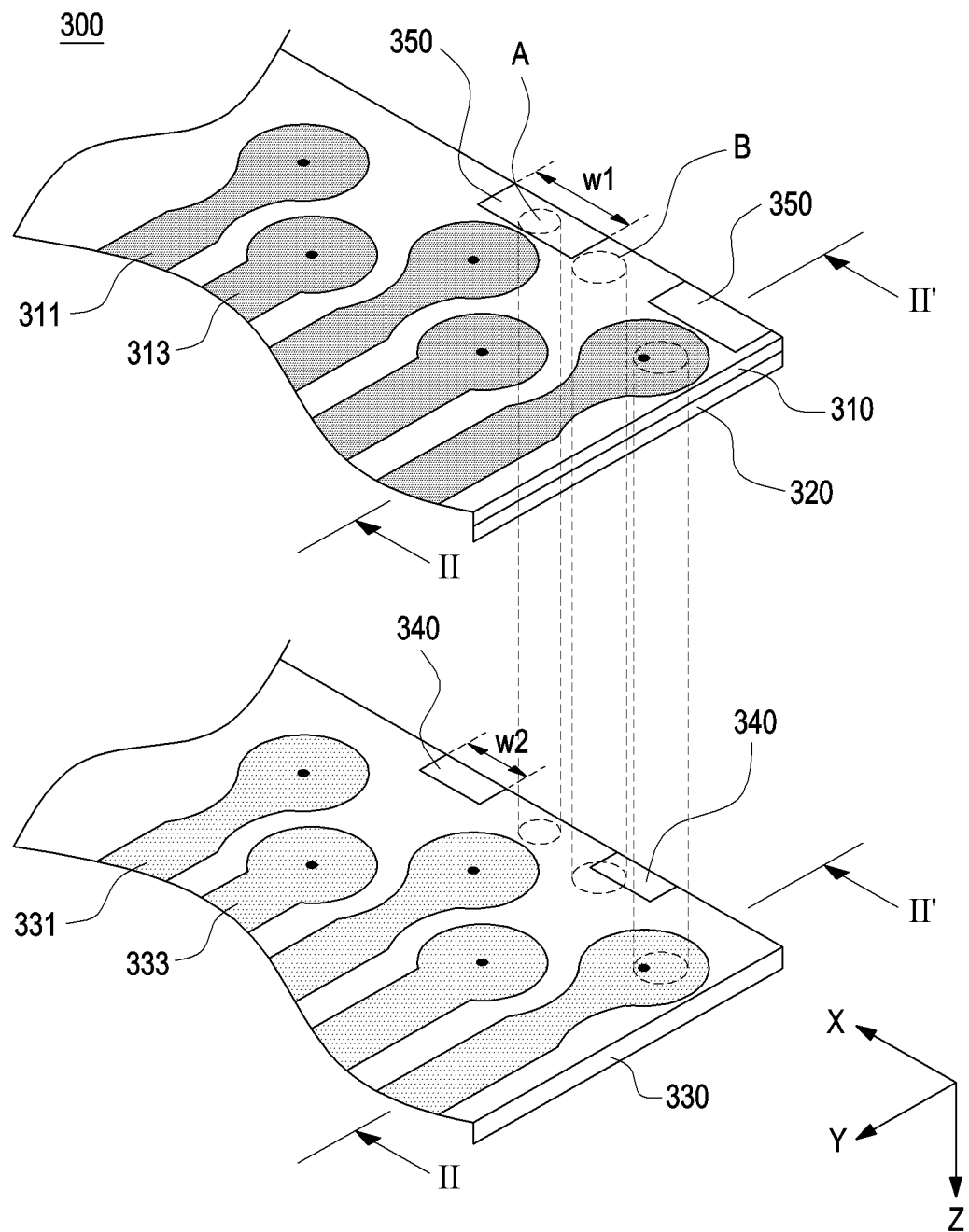
FIG. 8 is an exploded perspective view schematically illustrating a mail connector in which a plurality of reinforcing members are arranged on a first layer and a second layer according to various embodiments disclosed herein.
Figure 9A:
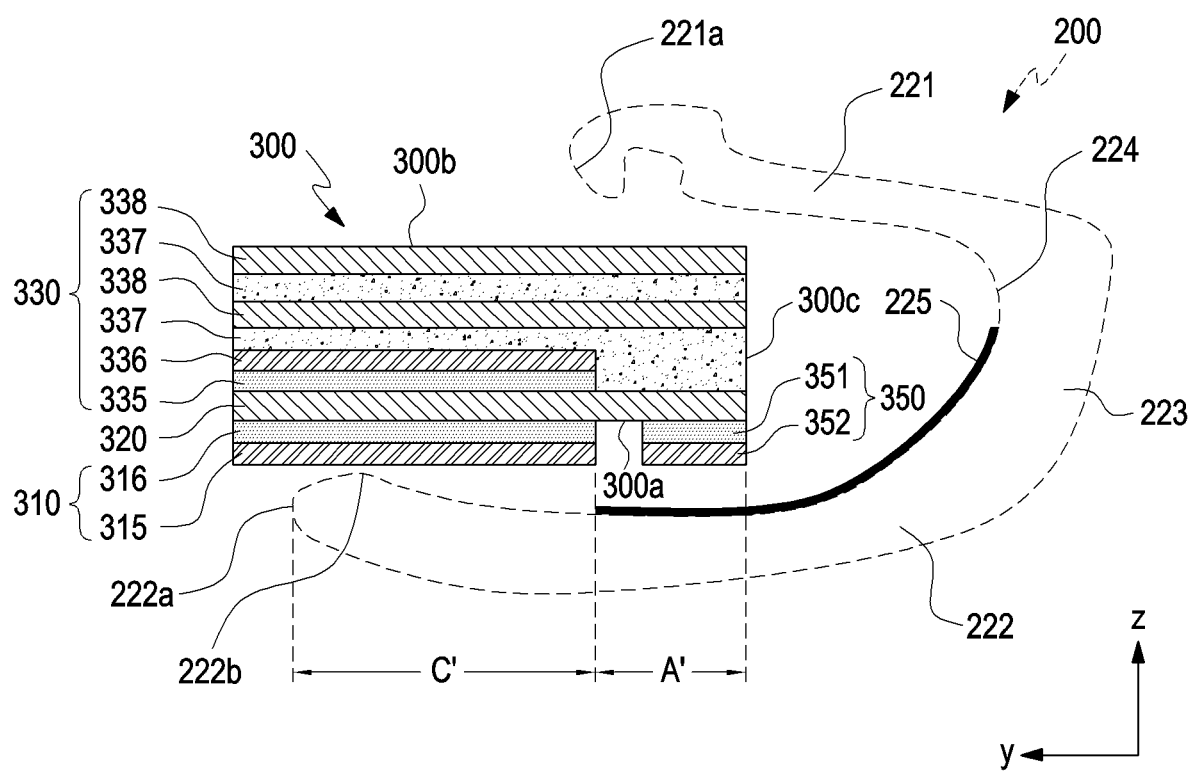
FIG. 9A is a conceptual view illustrating a cross section taken along line II-II' in FIG. 8, according to an embodiment.
Figure 9B:
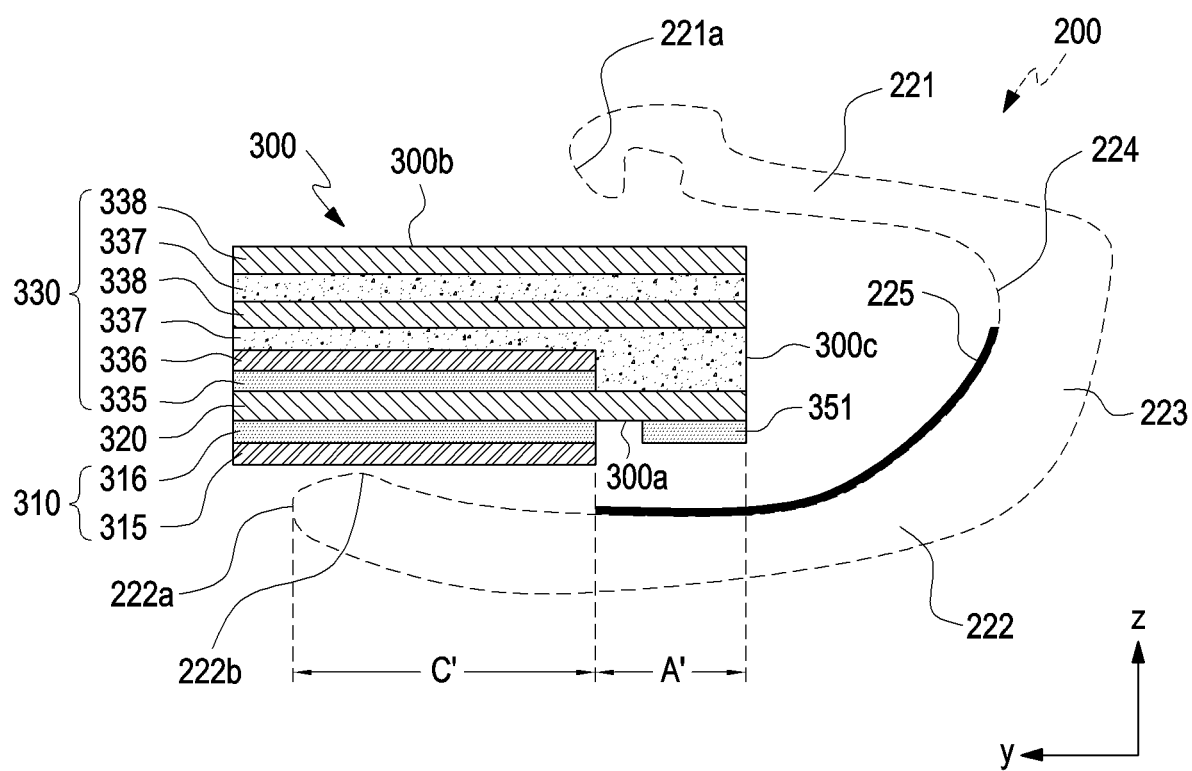
FIG. 9B is a conceptual view illustrating a cross section taken along line II-II' in FIG. 8, according to an embodiment different from that illustrated in FIG. 9A.
Figure 10:
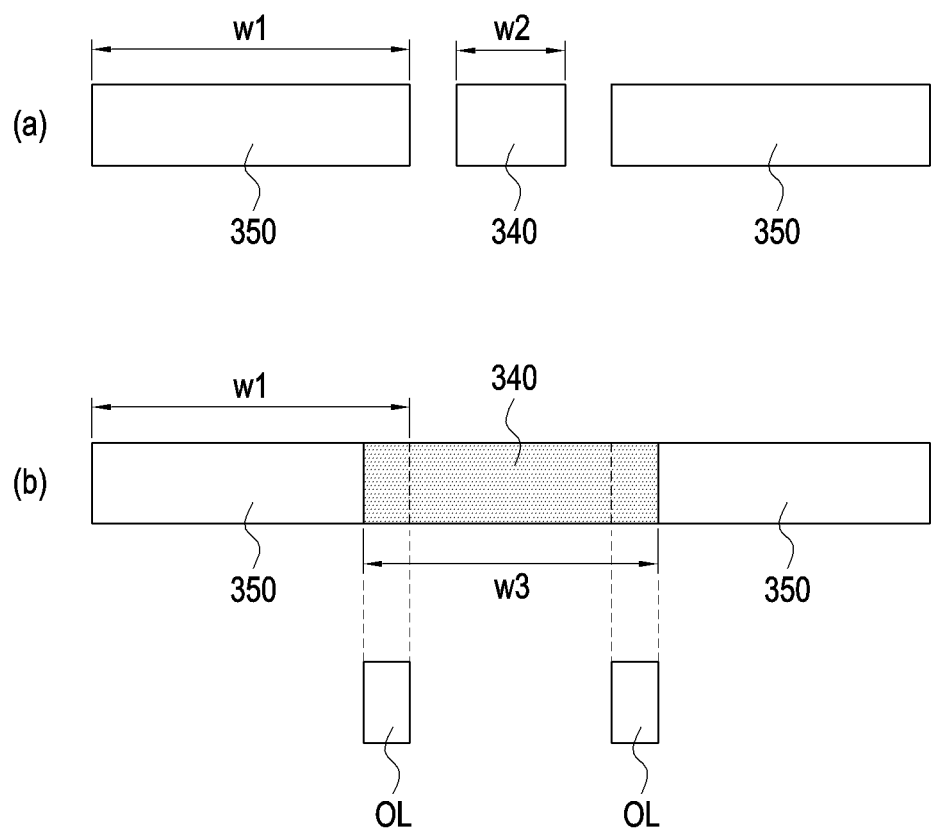
FIGS. 10A and 10B are conceptual views schematically illustrating the shapes of reinforcing members arranged on a first layer and a second layer according to various embodiments disclosed herein.

FIG. 8 is an exploded perspective view schematically illustrating the male connector 300 in which a plurality of reinforcing members 340 and 350 are disposed on the first and second layer 310 and 330, respectively, according to various embodiments disclosed herein. FIG. 9A is a conceptual view illustrating a cross section taken along line II-II' in FIG. 8 (e.g., II-II' in FIG. 4), according to an embodiment. FIG. 9B is a conceptual view illustrating a cross section taken along line II-II' in FIG. 8 (e.g., II-II' in FIG. 4), according to another embodiment.

According to various embodiments, a plurality of reinforcing members 340 may be formed on the second layer 330, and another plurality of reinforcing members 350 may be formed on the first layer 310. According to an embodiment, the plurality of reinforcing members 340 and 350 may be formed on both the second layer 330 and the first layer 310 in one stacked structure.

According to various embodiments, the plurality of reinforcing members 340 and 350 may be alternately arranged on the second layer 330 and the first layer 310 when viewed from above the first surface 300a in a projection manner.

FIG. 8 illustrates an embodiment in which a plurality of reinforcing members 350 are arranged over a region A of the first layer 310 and another plurality of reinforcing members 340 are arranged over a region B of the second layer 330. According to another embodiment, a plurality of reinforcing members 350 may be arranged over the region B of the first layer 310, and another plurality of reinforcing members 340 may be arranged over the region A of the second layer 330.

Referring to FIGS. 9A and 9B together, a cross section of the reinforcing member located in the direction II-II' in FIG. 8 (e.g., II-II' in FIG. 4) among the plurality of reinforcing members 350 can be seen. As in the embodiment illustrated in FIGS. 9A and 9B, in the electronic device 100 according to various embodiments, the reinforcing members 350 may be formed of a conductive film or a combination of a conductive film and a plating layer. These reinforcing members 350 are disposed in at least a portion of the periphery of the stacked structure, and thus may be exposed to the outside through the third surface 300c. At this time, even if the adhesive layers 337 are in contact with the contact end portions 222b of the contact portions 222 of the female connector 200, the adhesive layers 337 are protected by the reinforcing members 350, and thus the adhesive components can be prevented from being transferred. Here, unlike the reinforcing members 340 described above, the reinforcing members 350 are disposed on the first layer (or on the first surface 300a), and thus the adhesive layers can be protected from a direct impact applied by the contact end portions 222b of the contact portions 222.

FIGS. 10A and 10B are conceptual views illustrating the shapes of the reinforcing members 340 and 350 arranged on the first layer (e.g., 310 in FIG. 4) and a second layer (e.g., 330 in FIG. 4) when the stacked structure is viewed from above the first surface (e.g., 300a in FIG. 4) in a projection manner.

According to various embodiments, the plurality of reinforcing members 340 and 350 may include a region OL in which at least some of the reinforcing members 350 arranged on the second layer 330 and at least some of the reinforcing members 340 arranged on the first layer 310 overlap each other when viewed from above the first surface 300a in a projection manner.

According to various embodiments, the plurality of reinforcing members 340 and 350 respectively disposed on the second layer (e.g., 330 in FIG. 4) and the first layer 310 may be designed to have different widths. For example, the reinforcing members 340 disposed on the second layer (e.g., 330 in FIG. 4) may have a width w2, and the reinforcing members 350 arranged on the first layer (e.g., 310 in FIG. 4) may have a width w1.

According to various embodiments, since the reinforcing members 340 and 350 may be formed of a member having higher rigidity than the base film 320, for example, a metallic material (e.g., copper or a copper alloy), it can be said that when the reinforcing members 340 and 350 have a larger width w, the rigidity of the corresponding stacked structure has a higher rigidity. Using this point, among the plurality of reinforcing members 340 and 350, the width w2 of the reinforcing members 340 arranged on the second layer 330 may be set to be narrower than the width w1 of the reinforcing members 350 arranged on the first layer 310. According to an embodiment, the adhesive layer 337 included in the second layer 330 may be surrounded by the base film 320 and the insulating resin layer 338 adjacent thereto. That is, the second layer 330 may have a relatively strong durability against external impacts compared to the first layer 310. Therefore, even if the width w2 of the reinforcing members 340 arranged on the second layer 330 is narrower than the width w1 of the reinforcing members 350 arranged on the first layer 310, it is possible to secure sufficient durability to prevent the phenomenon of poor contact.

According to various embodiments, the plurality of reinforcing members 340 and 350, which are respectively arranged on the second layer (e.g., 330 in FIG. 4) and the first layer 310 may overlap each other as in the embodiment illustrated in FIG. 10B. For example, when the width of the reinforcing members 340 arranged on the second layer (e.g., 330 in FIG. 4) has a width w3 greater than the width w1 illustrated in FIG. 10A, the plurality of reinforcing members 340 and 350, which are respectively arranged on the layer (e.g., 330 in FIG. 4) and the first layer 310 may have a region OL in which the reinforcing members 340 and 350 overlap each other when viewed from above the first surface 300a in a projection manner. According to an embodiment, when the width w3 of the reinforcing members 340 arranged on the second layer (e.g., 330 in FIG. 4) is larger than that illustrated in the drawing, the size of the overlapping region OL can also be expanded further.

Figure 11:
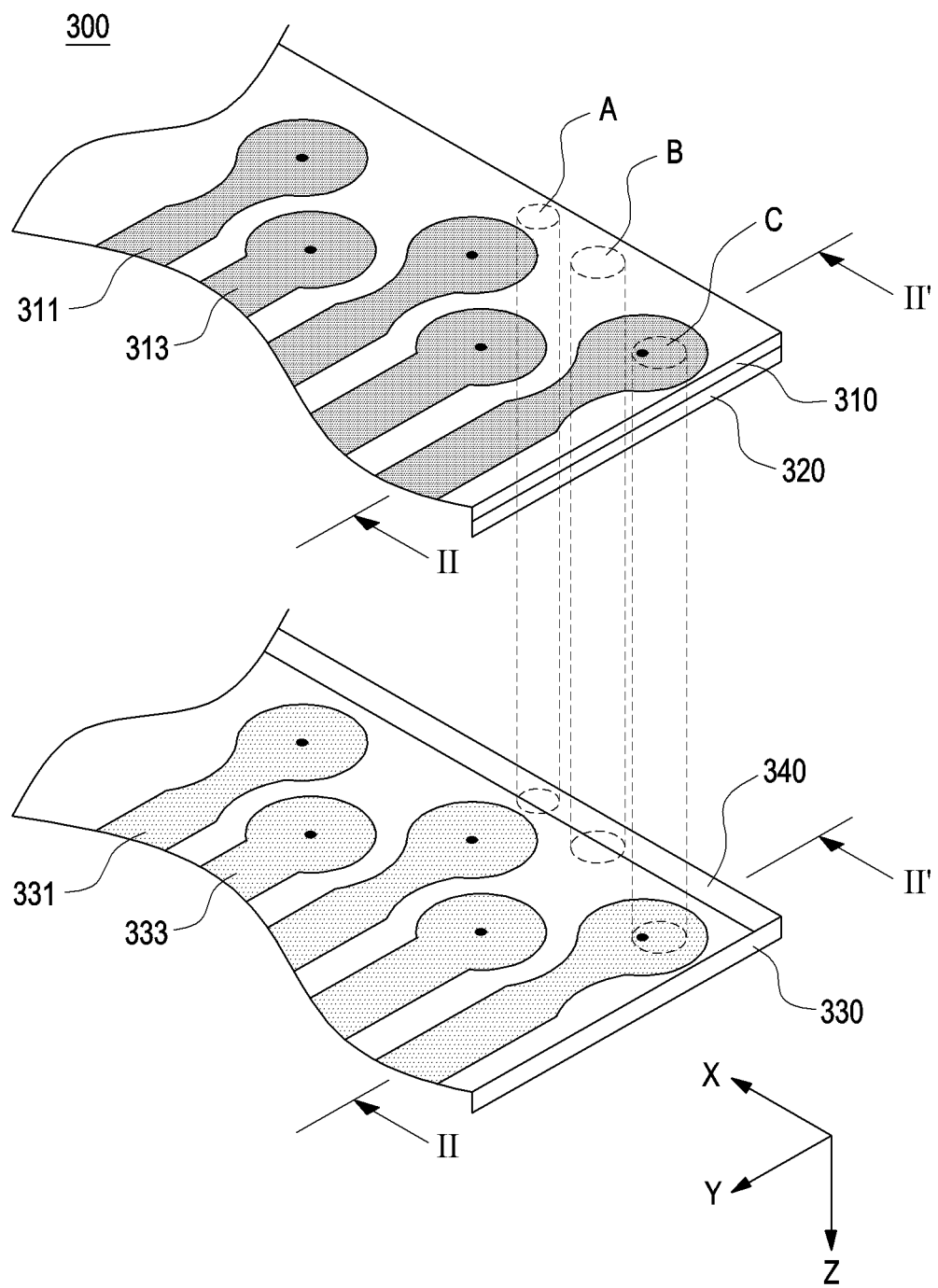
FIG. 11 is an exploded perspective view schematically illustrating a mail connector in which a plurality of reinforcing members are successively arranged on a second layer according to various embodiments disclosed herein.
Figure 12:
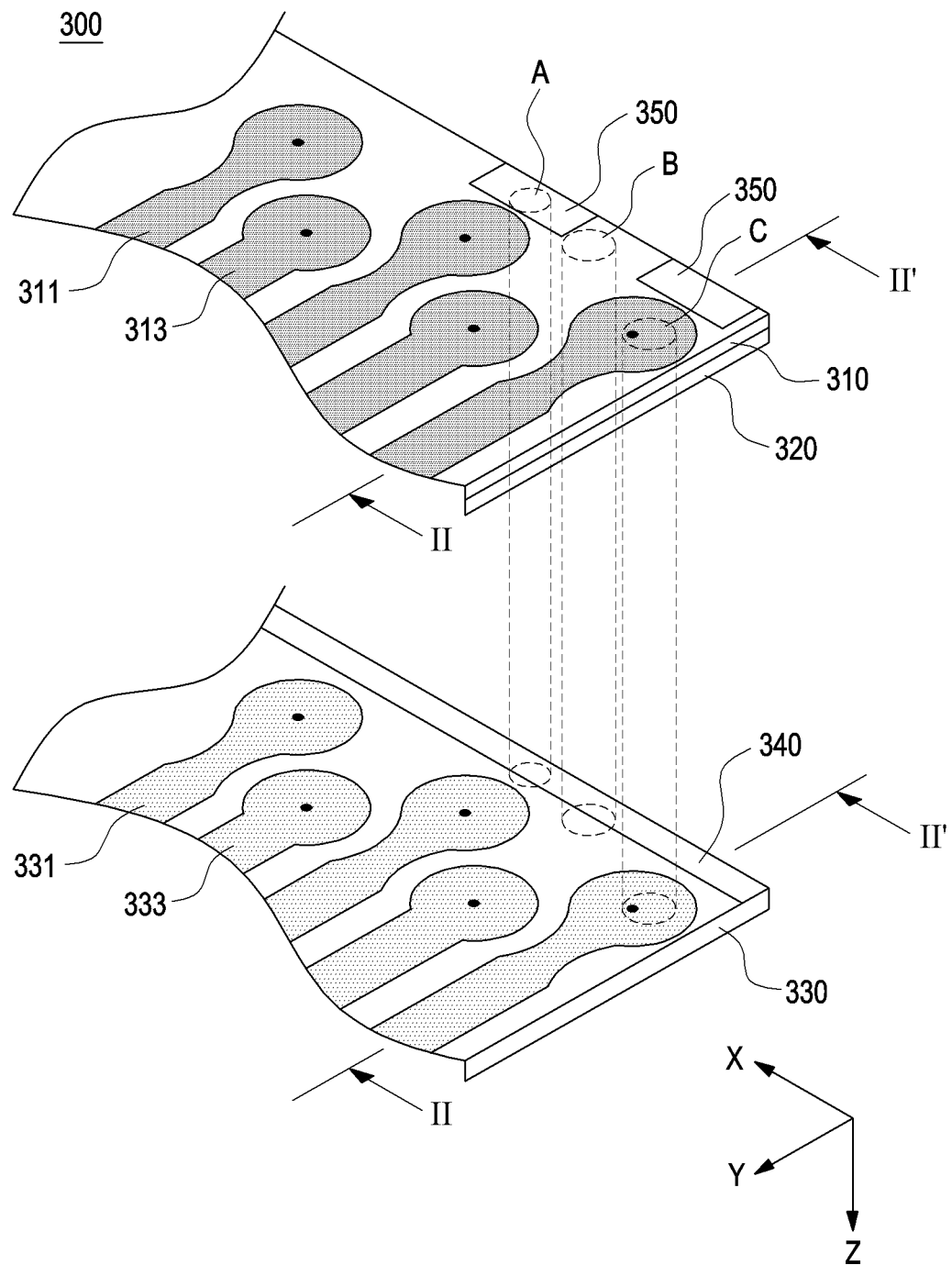
FIG. 12 is an exploded perspective view schematically illustrating a mail connector in which a plurality of reinforcing members are arranged on a first layer and a second layer according to an embodiment different from that illustrated in FIG. 8.
Figure 13A:
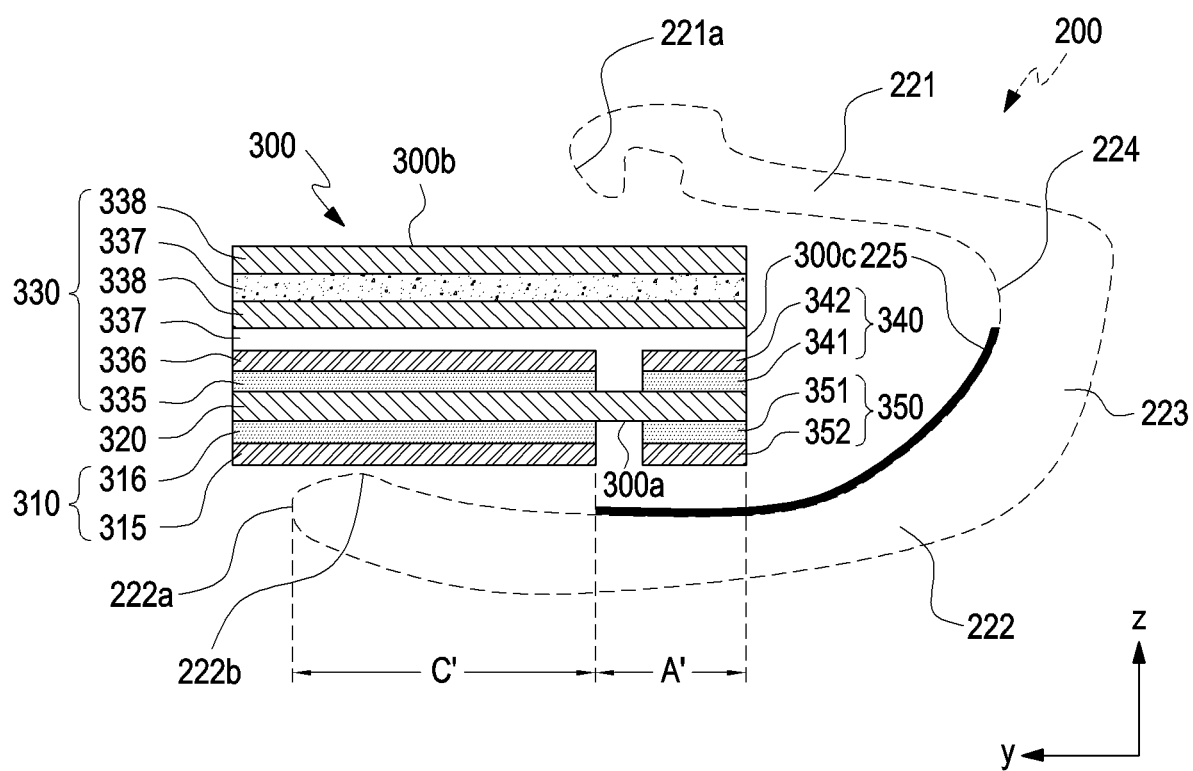
FIG. 13A is a conceptual view illustrating a cross section taken along line II-II' in FIG. 12, according to an embodiment.
Figure 13B:
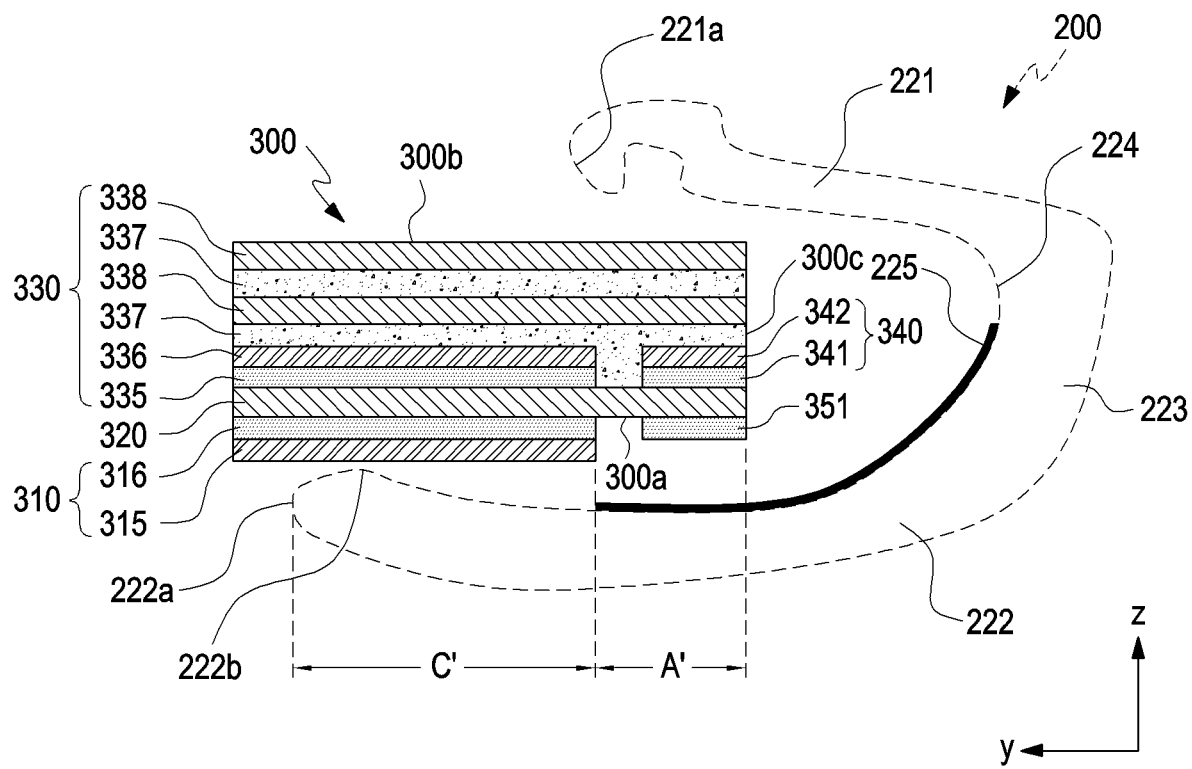
FIG. 13B is a conceptual view illustrating a cross section taken along line II-II' in FIG. 12, according to an embodiment different from that illustrated in FIG. 13A.

FIG. 11 is an exploded perspective view schematically illustrating a male connector 300 in which a plurality of reinforcing members 340 are successively arranged on the second layer 330 (e.g., 330 in FIG. 4) according to various embodiments disclosed herein. FIG. 12 is an exploded perspective view schematically illustrating a male connector 300 having a plurality of reinforcing members 340 and 350, which are arranged on the first layer 310 (e.g., 310 in FIG. 4) and a second layer 330 (e.g., 330 in FIG. 4) according to an embodiment different from that illustrated in FIG. 8. FIG. 13A is a conceptual view illustrating a cross section taken along line II-II' in FIG. 12 (e.g., II-II' in FIG. 4), according to an embodiment. FIG. 13B is a conceptual view illustrating a cross section taken along line II-II' in FIG. 12 (e.g., II-II' in FIG. 4), according to an embodiment different from that illustrated in FIG. 13A.

According to various embodiments, the plurality of reinforcing members 340 may be successively arranged along a direction parallel to the first direction on the second layer 330. For example, when the first direction corresponds to a direction parallel to the x axis in FIG. 4, the plurality of reinforcing members 340 may be arranged to extend in the width direction of the male connector 300.

Referring to FIG. 12, it is illustrated that a plurality of reinforcing members 340 arranged on the second layer 330 are successively arranged in a direction parallel to the first direction, and a plurality of reinforcing members 350 are arranged on the first layer 310. Here, the plurality of reinforcing members 340 arranged on the second layer 330 may be integrally formed so as to form a single reinforcing member having a substantially long length. According to the embodiment illustrated in FIG. 12, a region (e.g., OL of FIG. 10B) in which the reinforcing members 340 and 350 overlap each other by the width length of the plurality of reinforcing members 350 arranged on the first layer 310 may be formed.

Referring to FIGS. 13A and 13B together, a cross section of the reinforcing member located in the direction II-II' in FIG. 12 (e.g., II-II' in FIG. 4) among the plurality of reinforcing members 340 and 350 can be seen. As in the embodiment illustrated in FIGS. 13A and 13B, in the electronic device 100 according to various embodiments, the reinforcing members 350 may be formed of a conductive film or a combination of a conductive film and a plating layer. These reinforcing members 350 are disposed in at least a portion of the periphery of the stacked structure, and thus may be exposed to the outside through the third surface 300c. At this time, even if the adhesive layers 337 are in contact with the contact end portions 222b of the contact portions 222 of the female connector 300, the adhesive layers 337 can be protected by the reinforcing members 350, and thus the adhesive components can be prevented from being transferred. According to this, since the plurality of reinforcing members 340 and 350 are arranged on one surface and another surface of the base film 320, respectively, and are capable of protecting the adhesive layer 337, the transfer of the adhesive components can be more effectively prevented compared to the above-described embodiments.

Figure 14:
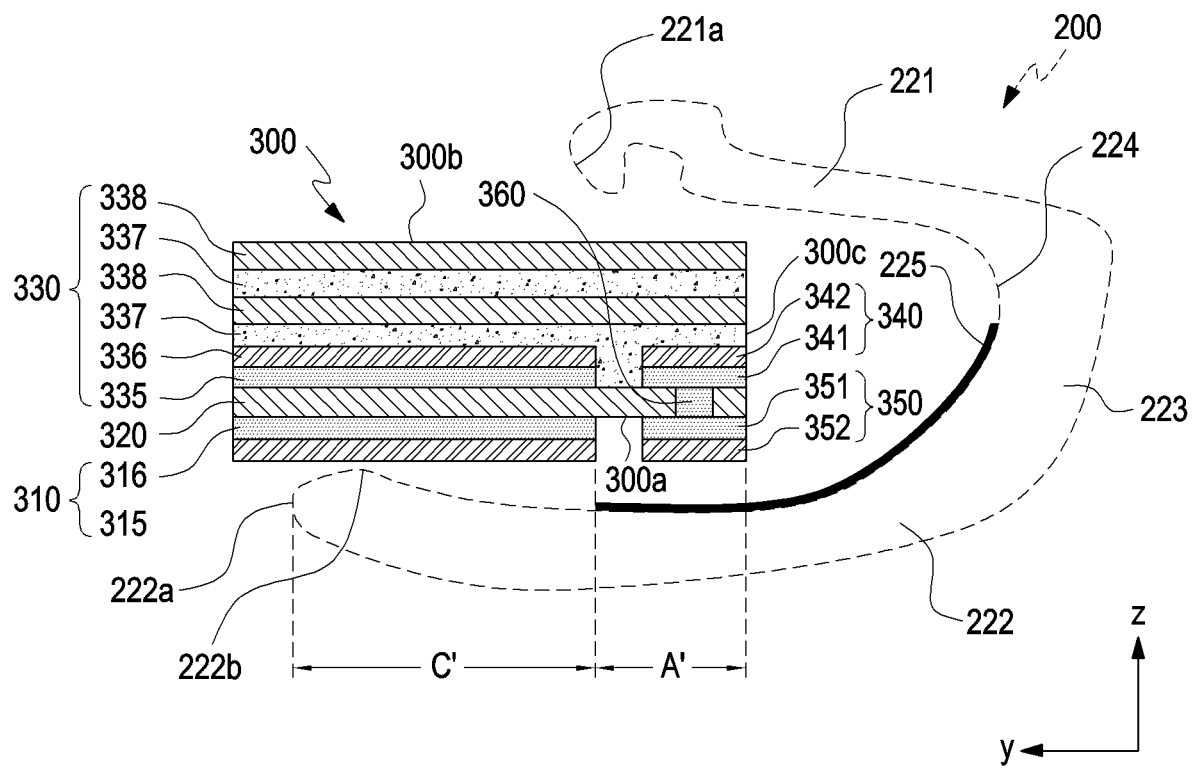
FIG. 14 is a conceptual view schematically illustrating the state in which reinforcing members arranged on a first layer and a second layer according to various embodiments disclosed herein are connected by a via.

FIG. 14 is a conceptual view illustrating the state in which the reinforcing members 340 and 350 arranged on the first layer 310 and the second layer 330 are connected by vias 360 according to various embodiments disclosed herein.

According to various embodiments, the vias 360 may be formed to connect the reinforcing members 340 arranged on the second layer 330 and the reinforcing members 350 arranged on the first layer 310. Here, the vias 360 may be formed of the same material as the reinforcing members 340 arranged on the second layer 330 and the reinforcing members 350 arranged on the first layer 310 so as to integrally connect the reinforcing members in the front row and the reinforcing members in the rear row.

According to various embodiments, the vias 360 may be formed only in the overlapping regions OL. For example, in the stacked structure according to the embodiment illustrated in FIG. 10A, the vias 360 cannot be formed, and in the stacked structure according to the embodiment illustrated in FIG. 10B, the vias 360 can be formed.

The electronic device 100 according to various embodiments disclosed herein may have an advantage in manufacturing in that, since the reinforcing members of the front row and the rear row are connected rather than connecting the contacts formed on the conductive lines of the front row and the rear row, the vias 360 can be formed further outside the position where the conductive lines are formed.

Figure 15:
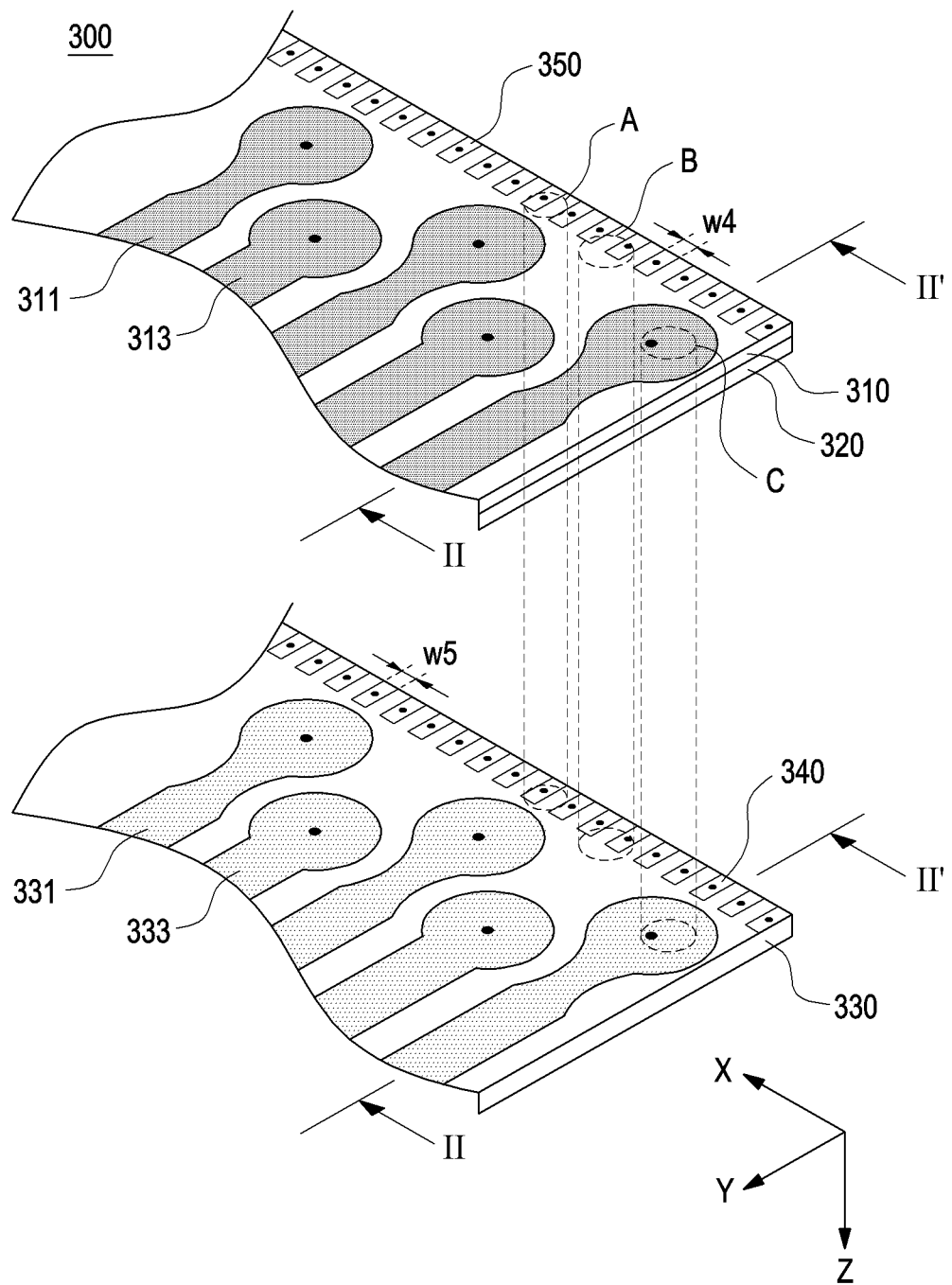
FIG. 15 is an exploded perspective view schematically illustrating a mail connector in which a plurality of reinforcing members are arranged on a first layer and a second layer according to an embodiment different from those illustrated in FIGS. 8 and 12.

FIG. 15 is an exploded perspective view schematically illustrating a male connector 300 having a plurality of reinforcing members 350 and 310, which are arranged on the first layer 310 (e.g., 310 in FIG. 4) and a second layer 330 (e.g., 330 in FIG. 4) according to an embodiment different from those illustrated in FIGS. 8 and 12.

When comparing the embodiment illustrated in FIG. 15 with the embodiments illustrated in FIGS. 8 and 12, the widths w4 and w5 of the plurality of reinforcing members 350 and 340 are formed to be relatively narrow, and a great number of reinforcing members 350 and 340 may be arranged in the width direction of the male connector 300. According to an embodiment, by arranging a plurality of reinforcing members 350 and 340 having relatively narrow widths w4 and w5 in a number corresponding to the number of conductive pins (e.g., 220 in FIG. 3A), it is possible to prevent a short of an electrical signal in the female connector (e.g., 200 in FIG. 3A) when inserting the male connector 300 into the female connector (e.g., 200 in FIG. 3A).

According to the embodiments described above, even if the male connector (e.g., 300 in FIG. 2) is damaged by contact in the process of being fastened with the female connector (e.g., 200 in FIG. 2), or the surfaces of the contact portions are damaged due to various physical impacts applied to the electronic device (e.g., 100 in FIG. 2) after fastening, it is possible to prevent the adhesive components of the adhesive layers of the male connector (e.g., 200 in FIG. 2) from being transferred to the contact portions (e.g., 222 in FIG. 3B) of the female connector (e.g., 200 in FIG. 2). That is, there is an advantage of preventing various problems of poor contact occurring in a connector in advance.

According to various embodiments disclosed herein, it is possible to provide an electronic device (e.g., 100 in FIG. 1) including: a housing (e.g., 101 in FIG. 1); a first electronic component (e.g., 120 in FIG. 2) inside the housing; a printed circuit board (e.g., 105 in FIG. 2) inside the housing; a second electronic component (e.g., 130 in FIG. 2) mounted on the printed circuit board inside the housing; a female connector (e.g., 200 in FIG. 3A) mounted on the printed circuit board and electrically connected to the second electronic component, the female connector including a plurality of conductive pins (e.g., 220 in FIG. 3A), which are spaced apart from each other, aligned in a first direction (e.g., a direction parallel to the x direction in FIG. 3A), and electrically connected to the second electronic component, each of the plurality of conductive pins including a U-shaped portion (e.g., 224 in FIG. 3B); and a male connector (e.g., 300 in FIG. 4) electrically connected to the first electronic component and having a stacked structure including a portion inserted into the U-shaped portion in a second direction (e.g., a direction parallel to the y direction in FIG. 3A) substantially perpendicular to the first direction, wherein the stacked structure may include: a first surface (e.g., 300a in FIG. 4) formed of a first material, which is an insulative material; a second surface (e.g., 300b in FIG. 4) facing away from the first surface; a plurality of first conductive lines (e.g., 311 and 313 in FIG. 4) electrically connected to the first electronic component and exposed through the first surface, each of the plurality of first conductive lines comes into electrical contact with the U-shaped portion of each of the plurality of conductive pins; and a plurality of reinforcing members (e.g., 340 in FIG. 6) arranged in at least a portion of a periphery of the stacked structure when viewed from above the first surface, the plurality of reinforcing members being inserted into the U-shaped portion more deeply than the first conductive lines, and the plurality of reinforcing members being formed of a second material having a higher rigidity than the first material.

According to various embodiments, the first conductive lines (e.g., 311 and 313 in FIG. 4) may be formed of a third material, which is a conductive material, and the second material may be the same as the third material.

According to various embodiments, the third may contain copper.

According to various embodiments, the first electronic component (e.g., 120 in FIG. 2) may include a display, and the second electronic component (e.g., 130 in FIG. 2) may include a processor.

According to various embodiments, the female connector (e.g., 200 in FIG. 2) may include an insulating material (e.g., 225 in FIG. 7A) that covers at least a portion of the U-shaped portions (e.g., 224 in FIG. 3B), and the insulating material may be interposed between the reinforcing members and the U-shaped portions.

According to various embodiments, each of the plurality of conductive pins (e.g., 220 in FIG. 3B) may include: a support portion (e.g., 221 in FIG. 3B) located in an upper portion of the conductive pin when viewed from a side, and configured to support the second surface (e.g., 300b in FIG. 4) of the male connector (e.g., 300 in FIG. 4); a contact portion (e.g., 222 in FIG. 3B) located in a lower portion of the conductive pin when viewed from a side, and configured to come into electrical contact with the first surface (e.g., 300a in FIG. 4); and a connection portion (e.g., 223 in FIG. 3B) integrally connecting the support portion and the contact portion. At least a portion of the support portion, at least a portion of the contact portion, and at least a portion of the connection portion may form the U-shaped portion.

According to various embodiments, the stacked structure of the male connector (e.g., 300 in FIG. 4) may include: a base film (e.g., 320 in FIG. 4); a first layer (e.g., 310 in FIG. 4) disposed on one surface of the base film and including the first conductive lines; and a second layer (e.g., 330 in FIG. 4) disposed on another surface of the base film, forming the second surface, and including the second conductive lines.

According to various embodiments, the plurality of reinforcing members (e.g., 340 in FIG. 6) may be arranged on the second layer (e.g., 330 in FIG. 6).

According to various embodiments, the plurality of reinforcing members (e.g., 350 in FIG. 8) may be arranged on the first layer (e.g., 310 in FIG. 8).

According to various embodiments, the plurality of reinforcing members (e.g., 340 and 350 in FIG. 8) may be arranged on the second layer (e.g., 330 in FIG. 8) and the first layer (e.g., 310 in FIG. 8).

According to various embodiments, the plurality of reinforcing members (e.g., 340 and 350 in FIG. 8) may be arranged alternately on the second layer (e.g., 330 in FIG. 8) and on the first layer (e.g., 310) when viewed from above the first surface (e.g., 300a in FIG. 4).

According to various embodiments, the plurality of reinforcing members (e.g., 340 in FIG. 11) are successively arranged in a direction parallel to the first direction (e.g., a direction parallel to the x direction in FIG. 11) on the second layer (e.g., 330 in FIG. 11).

According to various embodiments, the plurality of reinforcing members (e.g., 340 and 350 in FIG. 11) may include an overlapping region (e.g., OL in FIG. 10) in which at least some of the reinforcing members (e.g., 340 in FIG. 11) arranged on the second layer (e.g., 330 in FIG. 11) and at least some of the reinforcing members (e.g., 350 in FIG. 11) arranged on the first layer (e.g., 310 in FIG. 11) overlap each other when viewed from above the first surface (e.g., 300a in FIG. 4).

According to various embodiments, in the overlapping region (e.g., OL in FIG. 10), a via (e.g., 360 in FIG. 14) is formed to connect the reinforcing member arranged on the second layer (e.g., 330 in FIG. 11) and the reinforcing member arranged on the first layer (e.g., 310 in FIG. 11).

According to various embodiments, among the plurality of reinforcing members (e.g., 340 and 350 in FIG. 8), the reinforcing members arranged on the second layer (e.g., 330 in FIG. 8) may have a width w2 narrower than the width w1 of the reinforcing member arranged on the first layer (e.g., 310 in FIG. 8).

According to various embodiments, it is possible to provide an electronic device (e.g., 100 in FIG. 1) including: a housing (e.g., 101 in FIG. 1); a first electronic component (120 in FIG. 2) inside the housing; a second electronic component (120 in FIG. 1) arranged inside the housing and spaced apart from the first electronic component; a female connector (e.g., 200 in FIG. 3A) electrically connected to the second electronic component, the female connector including a plurality of conductive pins; a male connector (e.g., 300 in FIG. 4) electrically connected to the first electronic component and configured to come into contact with at least some of the plurality of conductive pins (e.g., 220 in FIG. 3A) of the female connector, the male connector including a base film (e.g., 320 in FIG. 7A), a conductive layer (e.g., 316 in FIG. 7A) formed on one surface of the base film, and an adhesive layer (e.g., 337 in FIG. 7A) disposed on the another surface of the base film so as to form a stacked structure; and a plurality of reinforcing members (e.g., 340 in FIG. 7A) provided on at least one of one surface of the base film and the another surface thereof so as to form at least a portion of the periphery of the stacked structure.

According to various embodiments, the plurality of reinforcing members (e.g., 340 and 350 in FIG. 10) may include an overlapping region (e.g., OL in FIG. 10) in which at least some of the reinforcing members (e.g., 340 in FIG. 10) arranged on one surface of the base film (e.g., 320 in FIG. 7A) and at least some of the reinforcing members (e.g., 350 in FIG. 10) arranged on another surface of the base film overlap each other when viewed from above the top surface of the stacked structure.

According to various embodiments, each of the plurality of conductive pins (e.g., 220 in FIG. 3A) may include the U-shaped portion (e.g., 224 in FIG. 3B), and an insulating material (e.g., 225 in FIG. 7A) covering at least a portion of the U-shaped portion.

According to various embodiments, it is possible to provide a connector including: a female connector (e.g., 200 in FIG. 3A) including a plurality of conductive pins (e.g., 220 in FIG. 3A); a male connector (e.g., 300 in FIG. 4) configured to come into contact with at least some of the plurality of conductive pins of the female connector, the male connector including a base film (e.g., 320 in FIG. 7A), a conductive layer (e.g., 316 in FIG. 7A) disposed on one surface of the base film, and an adhesive layer (e.g., 337 in FIG. 7A) disposed on another surface of the base film, thereby forming a stacked structure; and a plurality of reinforcing members (e.g., 340 in FIG. 7A) provided on at least one of one surface of the base film and the rear surface of the base film so as to form at least a portion of the periphery of the stacked structure.

Although specific embodiments have been described in the detailed description of the disclosure, it will be apparent to those skilled in the art that various modifications and changes may be made thereto without departing from the scope of the disclosure.

What is claimed is:

1. An electronic device comprising:
a housing;
a first electronic component inside the housing;
a printed circuit board inside the housing;
a second electronic component mounted on the printed circuit board inside the housing;
a female connector mounted on the printed circuit board and configured to be electrically connected to the second electronic component, the female connector comprising a plurality of conductive pins, which are spaced apart from each other, aligned in a first direction, and configured to be electrically connected to the second electronic component, each of the plurality of conductive pins including a U-shaped portion; and
a male connector configured to be electrically connected to the first electronic component and having a stacked structure comprising a portion configured to be inserted into the U-shaped portion in a second direction substantially perpendicular to the first direction,
wherein the stacked structure comprises:
a first surface formed of a first material, which is an insulative material;
a second surface facing away from the first surface;
a plurality of first conductive lines configured to be electrically connected to the first electronic component and exposed through the first surface, the first conductive lines being configured to come into electrical contact with the U-shaped portion of the plurality of conductive pins, respectively; and
a plurality of reinforcing members arranged in at least a portion of a periphery of the stacked structure when viewed from above the first surface, the plurality of reinforcing members being configured to be inserted into the U-shaped portion more deeply than the plurality of first conductive lines, and the plurality of reinforcing members being formed of a second material having a higher rigidity than the first material.

2. The electronic device of claim 1, wherein the first conductive lines are formed of a third material, which is a conductive material, and the second material is a same as the third material.

3. The electronic device of claim 2, wherein the third material comprises copper.

4. The electronic device of claim 1, wherein the first electronic component comprises a display, and the second electronic component comprises a processor.

5. The electronic device of claim 1, wherein the female connector comprises an insulating material that covers at least a portion of the U-shaped portion, and the insulating material is interposed between the reinforcing members and the U-shaped portion.

6. The electronic device of claim 1, wherein each of the plurality of conductive pins comprises:
a support portion located in an upper portion of the plurality of conductive pins when viewed from a side the plurality of conductive pins, and configured to support the second surface of the male connector;
a contact portion located in a lower portion of the plurality of conductive pins when viewed from a side the plurality of conductive pins, and configured to come into electrical contact with the first surface; and
a connection portion integrally connecting the support portion and the contact portion, and
wherein at least a portion of the support portion, at least a portion of the contact portion, and at least a portion of the connection portion form the U-shaped portion.

7. The electronic device of claim 6, wherein the stacked structure of the male connector comprises:
a base film;
a first layer disposed on one surface of the base film and comprising the first conductive lines; and
a second layer disposed on another surface of the base film, forming the second surface, and comprising second conductive lines.

8. The electronic device of claim 7, wherein the plurality of reinforcing members are arranged on the second layer.

9. The electronic device of claim 7, wherein the plurality of reinforcing members are arranged on the first layer.

10. The electronic device of claim 7, wherein the plurality of reinforcing members are arranged on the second layer and the first layer.

11. The electronic device of claim 10, wherein, in the plurality of reinforcing members, a plurality of reinforcing members included in the second layer and a plurality of reinforcing members included in the first layer are arranged alternately when viewed from above the first surface.

12. The electronic device of claim 10, wherein the plurality of reinforcing members are successively arranged in a direction parallel to the first direction on the second layer.

13. The electronic device of claim 10, wherein the plurality of reinforcing members comprise an overlapping region in which at least some of the reinforcing members arranged on the second layer and at least some of the reinforcing members arranged on the first layer overlap each other when viewed from above the first surface.

14. The electronic device of claim 13, wherein in the overlapping region, a via is formed to connect at least one of the plurality of reinforcing members arranged on the second layer and at least one of the plurality of reinforcing members arranged on the first layer.

15. The electronic device of claim 10, wherein, among the plurality of reinforcing members, the plurality of reinforcing members arranged on the second layer has a width narrower than a width of the plurality of reinforcing members arranged on the first layer.

* * * * *